(12) United States Patent
Gasanov et al.

(10) Patent No.: US 9,337,866 B2
(45) Date of Patent: May 10, 2016

(54) APPARATUS FOR PROCESSING SIGNALS CARRYING MODULATION-ENCODED PARITY BITS

(71) Applicant: LSI Corporation, San Jose, CA (US)

(72) Inventors: Elyar Eldarovich Gasanov, Moscow (RU); Pavel Anatolyevich Panteleev, Moscow (RU); Yurii Sergeevich Shutkin, Moskow (RU); Andrey Pavlovich Sokolov, Moscow (RU); Ilya Vladimirovich Neznanov, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 53 days.

(21) Appl. No.: 14/104,368

(22) Filed: Dec. 12, 2013

(65) Prior Publication Data

US 2014/0359394 A1    Dec. 4, 2014

(30) Foreign Application Priority Data

Jun. 4, 2013    (RU) .................................. 2013125784

(51) Int. Cl.
*H03M 13/11*    (2006.01)
*H03M 13/00*    (2006.01)
(Continued)

(52) U.S. Cl.
CPC ...... *H03M 13/1111* (2013.01); *H03M 13/2957* (2013.01); *H03M 13/6325* (2013.01); *H03M 13/3972* (2013.01); *H03M 13/41* (2013.01)

(58) Field of Classification Search
CPC ............... H03M 13/2957; H03M 13/6343; H03M 13/1102; H03M 13/1111; H03M 13/13; H03M 13/258; H03M 13/3955; H03M 13/4146

USPC .................................................. 714/758, 792
See application file for complete search history.

(56) References Cited

U.S. PATENT DOCUMENTS

| 6,011,497 A | 1/2000 | Tsang et al. |
| 6,052,072 A | 4/2000 | Tsang et al. |

(Continued)

FOREIGN PATENT DOCUMENTS

WO    2005081410 A1    9/2005

OTHER PUBLICATIONS

Eric Lüthi et al., "High rate soft output Viterbi decoder," European Design and Test Conference, 1996, ED&TC 96, Proceedings, pp. 315-319.

(Continued)

*Primary Examiner* — James C Kerveros

(57) ABSTRACT

A receiver configured for use in a communication system, such as a magnetic recording channel, and having a soft-output channel detector provided with a soft-input/soft-output (SISO) modulation codec for parity bits of a block error-correction code. A transmitter of the communication system is configured to encode data by applying a modulation code to the parity bits that have been generated using the block error-correction code. The SISO modulation codec provides an interface between the soft-output channel detector and a parity-check decoder that enables decoding iterations between them in a manner that takes into account inter-bit correlations imposed by the modulation code. In some embodiments, the soft-output channel detector is configured to operate at a fractional rate and to process an input signal carrying non-binary symbols, and the parity-check decoder is configured to apply parity-check-based decoding that is based on a non-binary low-density parity-check code.

20 Claims, 12 Drawing Sheets

(51) Int. Cl.
  *H03M 13/29* (2006.01)
  *H03M 13/39* (2006.01)
  *H03M 13/41* (2006.01)

(56) References Cited

U.S. PATENT DOCUMENTS

| | | | |
|---|---|---|---|
| 6,536,010 B1* | 3/2003 | Brink | H03M 13/2957 714/774 |
| 6,643,814 B1 | 11/2003 | Cideciyan et al. | |
| 6,744,580 B2* | 6/2004 | Hattori et al. | 360/40 |
| 7,051,270 B2* | 5/2006 | Miyauchi et al. | 714/794 |
| 7,450,668 B2* | 11/2008 | Ghosh et al. | 375/341 |
| 7,464,318 B2* | 12/2008 | Koslov et al. | 714/759 |
| 7,716,564 B2* | 5/2010 | Yen et al. | 714/794 |
| 7,757,151 B2 | 7/2010 | Xu | |
| 8,091,009 B2* | 1/2012 | Motwani | 714/769 |
| 8,205,144 B1* | 6/2012 | Yadav | 714/785 |
| 8,321,770 B2 | 11/2012 | Fitzpatrick et al. | |
| 8,407,571 B2 | 3/2013 | Ashley et al. | |
| 8,583,983 B2* | 11/2013 | Wei | H03M 13/2775 714/702 |
| 2003/0074628 A1 | 4/2003 | Lee | |
| 2008/0240303 A1 | 10/2008 | Shao et al. | |
| 2008/0316071 A1 | 12/2008 | Coene et al. | |
| 2009/0185643 A1 | 7/2009 | Fitzpatrick et al. | |
| 2009/0319862 A1 | 12/2009 | Nguyen | |
| 2011/0197112 A1 | 8/2011 | Parthasarathy et al. | |

OTHER PUBLICATIONS

Marisa Lopez-Vallejo et al., "A Low-Power Architecture for Maximum a Posteriori Decoding" Conference on Signals, Systems and Computers, 2002, Conference Record of the Thirty-Sixth Asilomar, vol. 1, pp. 47-51.

Lucian Andrei Perişoară et al., "The Decision Reliability of MAP, Log-MAP,Max-Log-MAP and SOVA Algorithms for Turbo Codes," International Journal of Communications, Issue 1, vol. 2, 2008, pp. 65-74.

N. G. Kingsbury, et al., "Digital Filtering Using Logarithmic Arithmetic," Electronics Letters, Jan. 28, 1971, vol. 7 No. 2, pp. 56-58.

Silvio A. Abrantes, "From BCJR to turbo decoding:MAP algorithms made easier," © Silvio A. Abrantes, Apr. 2004, Technical Report, 2004, Downloaded from: < http://hdl.handle.net/10216/19735 > pp. 1-30.

Erich F. Haratsch et al., "A Radix-4 Soft-Output Viterbi Architecture," IEEE International Symposium on VLSI Design, Automation and Test, 2008, VLSI-DAT 2008, pp. 224-227.

S. M. Karim, "A Pipelined Architecture for High Throughput Efficient Turbo Decoder," Special Issue International Journal of Computer Applications (0975-8887), on Electronics, Information and Communication Engineering, ICEICE No. 1, Dec. 2011, pp. 12-16.

Andrew J. Viterbi, "An Intuitive Justification and a Simplified Implementation of the MAP Decoder for Convolutional Codes," IEEE Journal on Selected Areas in Communications, vol. 16, No. 2, Feb. 1998, pp. 260-264.

Joachim Hagenauer et al., "Iterative Decoding of Binary Block and Convolutional Codes," IEEE Transactions on Information Theory, vol. 42, No. 2, Mar. 1996, pp. 429-445.

Mohammad Ali Khalighi, "Effect of Mismatched SNR on the Performance of Log-MAP Turbo Detector," IEEE Transactions on Vehicular Technology, vol. 52, No. 5, Sep. 2003, pp. 1386-1397.

Javan A. Erfanian et al., "Low-Complexity Parallel-Structure Symbol-by-Symbol Detection for ISI Channels," IEEE Pacific Rim Conference on Communications, Computers and Signal Processing, 1989, pp. 350-353.

Jaekyun Moon et al., "Maximum Transition Run Codes for Data Storage Systems," IEEE Transactions on Magnetics, vol. 32, No. 5, Sep. 1996, pp. 3992-3994.

J. H. Han, "High Speed Max-Log-MAP Turbo SISO Decoder Implementation Using Branch Metric Normalization," IEEE Computer Society Annual Symposium on VLSI, 2005, Proceedings, pp. 173-178.

Jaekyun Moon et al., "Maximum Transition Run Codes for Data Storage Systems" IEEE Transactions on Magnetics, vol. 32, Issue No. 5, 1996, pp. 3992-3994.

Roy D. Cideciyan et al., "Maximum Transition Run Codes for Generalized Partial Response Channels," IEEE Journal on Selected Areas in Communications, vol. 19, No. 4, Apr. 2001 Issue No. 4, pp. 619-634.

Nazanin Samavati, "Serial Concatenation of Turbo Code and Space-time Block Code (Turbo Space-Time Code) over Rayleigh Fading Channel," Master's thesis, University of Waterloo, 2002, Downloaded from: < http://shannon2.uwaterloo.ca/~k1/t/Nazanin_Samavati.pdf > (96 pages).

Claude Berrou et al., "Near Shannon Limit Error—Correcting Coding and Decoding: Turbo-codes (1)," IEEE International Conference on Communications, 1993. ICC '93 Geneva, Technical Program, Conference Record, vol. 2, pp. 1064-1070.

R.W. Chang et al., "On Receiver Structures for Channels Having Memory," IEEE Transactions on Information Theory, 1966, vol. 12 , Issue No. 4, pp. 463-468.

L. R. Bahl, "Optimal Decoding of Linear Codes for Minimizing Symbol Error Rate," IEEE Transactions on Information Theory, 1974, vol. 20, Issue No. 2, pp. 284-287.

T. Lei Poo et al., "MTR and RLL Constraints with Unconstrained Positions," PhD Dissertation at the Electrical Engineering Department at Stanford University, Stanford CA, [Downloaded on Oct. 14, 2012] Downloaded from: <ita.ucsd.edu/workshop/06/papers/99.pdf> (5 pages).

Mr. Raghukrishna.S, "Implementation of Turbo Decoder Using Max-log-map Algorithm for Wireless Application," International Journal of Advanced Technology & Engineering Research (IJATER), vol. 2, Issue No. 4, Jul. 2012, pp. 246-251.

William E. Ryan, "Concatenated Convolutional Codes and Iterative Decoding," Department of Electrical and Computer Engineering, The University of Arizona, 2001, Downloaded from: <http://webee.technion.ac.il/people/sason/ryan_chapter.pdf> (29 pages).

S. Benedetto, "Serial Concatenation of Interleaved Codes: Performance Analysis, Design, and Iterative Decoding," IEEE Transactions on Information Theory, vol. 44, Issue No. 3, 1998, pp. 1-26.

T. Lei Poo et al., "Time-Varying Maximum Transition Run Constraints," IEEE Transactions on Information Theory, vol. 52, No. 10, Oct. 2006, pp. 4464-4480.

* cited by examiner

TABLE 1: CORRESPONDENCE BETWEEN BINARY SYMBOLS AT VARIOUS STAGES OF FILTER 920

| | | | | | | |
|---|---|---|---|---|---|---|
| AT INPUT OF 922 | k | l | m | n | o | p | q | r |
| AT OUTPUT OF 924 | q | r | s | t | u | v | w | x |
| AT OUTPUT OF 930 | w | x | y | z | a | b | c | d |

APPARATUS FOR PROCESSING SIGNALS CARRYING MODULATION-ENCODED PARITY BITS

FIELD

The present disclosure relates to communication and data-storage equipment and, more specifically but not exclusively, to a device configured to demodulate and decode signals carrying modulation-encoded parity bits.

BACKGROUND

In a magnetic recording channel, an error-correction code, such as a low-density parity-check (LDPC) code, is sometimes used together with a modulation code to improve the channel's performance characteristics. Two representative modulation codes that are often used in magnetic recording channels are a run-length-limited (RLL) code and a maximum-transition-run (MTR) code. An RLL code limits the number of consecutive zeros stored in a magnetic track to a specified maximum number, which can help the magnetic recording channel to reliably generate a clock signal using a phase-lock loop. An MTR code limits the number of consecutive ones in a magnetic track to a specified maximum number, which can help to alleviate the adverse effects of inter-symbol interference. However, one problem with a conventional magnetic recording channel is that parity bits of the error-correction code are not subjected to MTR or RLL coding, which causes the recorded data to sometimes have undesirable bit sequences despite the use of MTR or RLL coding on other parts of the codeword(s). The fact that a practical modulation codec for parity bits of a block error-correction code has not been sufficiently developed yet is at least partially responsible for this problem.

SUMMARY

Disclosed herein are various embodiments of a receiver configured for use in a communication system, such as a magnetic recording channel, and having a soft-output channel detector provided with a soft-input/soft-output (SISO) modulation codec for parity bits of a block error-correction code. A corresponding transmitter of the communication system is configured to encode data by applying a modulation code to the parity bits that have been generated using the block error-correction code. The SISO modulation codec provides an interface between the soft-output channel detector and a parity-check decoder that enables decoding iterations between them in a manner that takes into account inter-bit correlations imposed by the modulation code. In some embodiments, the soft-output channel detector is configured to operate at a fractional rate and to process an input signal carrying non-binary symbols, and the parity-check decoder is configured to apply parity-check-based decoding that is based on a non-binary low-density parity-check code.

BRIEF DESCRIPTION OF THE FIGURES

Other embodiments of the disclosure will become more fully apparent from the following detailed description and the accompanying drawings, in which:

FIG. 11 shows a table that defines the relationship between the binary symbols at different stages of the filter in the combined-detector/soft-MTR(3)-decoder shown in FIG. 9 according to an embodiment of the disclosure.

DETAILED DESCRIPTION

The following acronyms/abbreviations are used in the description of various embodiments and/or in the accompanying drawings:

ACS Add/Compare/Select;
BER Bit-Error Rate;
DMUX De-multiplexer;
ISI Inter-Symbol Interference;
LDPC Low-Density Parity Check;
LIFO Last In, First Out;
LLR Log-Likelihood Ratio;
MAP Maximum A Posteriori;
MLSE Maximum-Likelihood Sequence Estimation;
MTR Maximum Transition Run;
MUX Multiplexer;
NRZ Non-Return to Zero;
NRZI Non-Return-to-Zero Inverse;
RLL Run-Length Limited; and
SISO Soft-Input/Soft-Output.

Figure 1:
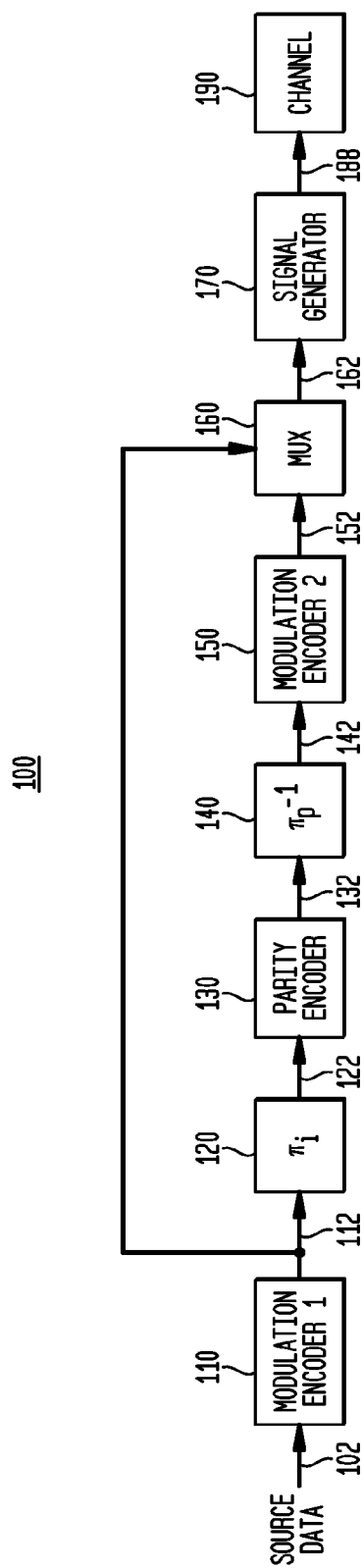
FIG. 1 shows a block diagram of a transmitter according to an embodiment of the disclosure.

FIG. 1 shows a block diagram of a transmitter 100 according to an embodiment of the disclosure. Transmitter 100 is configured to (i) receive an input data stream 102, (ii) apply modulation and parity-check coding to transform the input data stream into an output communication signal 188, and (iii) apply the output communication signal to a communication channel 190. Note that communication channel 190 is not part of transmitter 100. In its various embodiments, communication channel 190 can be a part of a magnetic memory system or an optical, wireless, or wireline data-transport link. For illustration purposes, the subsequent description is given in reference to communication channel 190 being a part of a magnetic memory system. However, contemplated embodiments are not so limited. From the provided description, one of ordinary skill in the art will be able to make and use transmitters and receivers suitable for being coupled to various alternative embodiments of communication channel 190.

Input data stream 102 comprises a sequence of bits, often referred to as original information bits. A first modulation encoder 110, to which input data stream 102 is directed in transmitter 100, is configured to apply a first (outer) modulation code to the sequence of original information bits. The result of this application is a data stream 112, copies of which are applied to an interleaver 120 and a multiplexer (MUX) 160. Data stream 112 satisfies the constraints of the first modulation code and typically carries more bits than input data stream 102. For example, an original information word in input data stream 102 might be 8-bit long, while a corresponding modulation-encoded word in data stream 112 might be 9-bit long. In this example, the first modulation code has a rate of 8/9. In various embodiments, the first modulation code can be an RLL code or an MTR code.

Interleaver 120 is configured to apply a first interleaving operation ($\pi_i$) to data stream 112, thereby generating a data stream 122. More specifically, the first interleaving operation changes the order of bits in a modulation-encoded word without changing the number of bits in it. Interleaver 120 then applies data stream 122 to a parity encoder 130.

Based on data stream 122, parity encoder 130 generates a parity-bit stream 132. More specifically, based on a word from data stream 132, parity encoder 130 generates a corresponding set of parity bits. For example, in one possible embodiment, parity encoder 130 can be configured to use a systematic LDPC code, wherein a generator matrix (G) consists of an identity sub-matrix (I) and a non-systematic parity-bit generator sub-matrix (P) concatenated together in the form of G=[I|P]. In this embodiment, for each interleaved modulation-encoded word $c_i$ from data stream 132, parity encoder 130 generates set $p_i$ of parity bits by applying non-systematic parity-bit generator sub-matrix P to $c_i$. Different sets $p_i$ corresponding to different interleaved modulation-encoded words $c_i$ are then concatenated at the output of parity encoder 130 to form data stream 132. Note that interleaved modulation-encoded words $c_i$ of data stream 122 are not included into data stream 132.

A de-interleaver 140 is configured to apply a de-interleaving operation ($\pi_p^{-1}$) to each parity-bit set $p_i$ of data stream 132. The resulting de-interleaved parity-bit sets are concatenated to generate a data stream 142. Data stream 142 is then applied to a second modulation encoder 150. Note that de-interleaving operation $\pi_p^{-1}$ is an inverse of a second interleaving operation ($\pi_p^{-1}$) used at a corresponding receiver, e.g., receiver 200 of FIG. 2. De-interleaving operation $\pi_p^{-1}$ is also related to interleaving operation $\pi_i$ applied in interleaver 120 in that it causes the bit order in data stream 142 to be independent of the bit reordering performed in interleaver 120. In other words, de-interleaving operation $\pi_p^{-1}$ reverses (cancels) the effect of interleaving operation $\pi_i$ on data stream 142.

One of ordinary skill in the art will appreciate that each of the terms "interleaving" and "de-interleaving" refers to an operation that changes the order of bits in a bit sequence in a accordance with a specified algorithm. Each interleaving operation $\pi$ has a corresponding de-interleaving operation $\pi^{-1}$ that undoes the change of the bit order such that $\pi\pi^{-1}=\pi^{-1}\pi=1$ (where "1" denotes an identity permutation, which maps each element of the sequence onto itself in the original order), and the designations of these two operations as an "interleaving operation" and a "de-interleaving operation" are relative. For example, let us assume that two interleaving operations $\pi_1$ and $\pi_2$ satisfy the following condition: $\pi_1\pi_2=\pi_2\pi_1=1$. Then, the relative nature of the designations means that each of operations $\pi_1$ and $\pi_2$ can be referred to as "interleaving" or "de-interleaving." More specifically, when operation $\pi_1$ is referred to as "interleaving," operation $\pi_2$ is referred to as "de-interleaving." Alternatively, when operation $\pi_2$ is referred to as "interleaving," operation $\pi_1$ is referred to as "de-interleaving."

In an alternative embodiment, interleaver 120 and de-interleaver 140 are optional and can both be omitted in transmitter 100.

Encoder 150 is configured to apply a second (inner) modulation code to each of the de-interleaved parity-bit sets of data stream 142 to generate a data stream 152 having modulation-encoded, de-interleaved parity-bit sets. Each modulation-encoded, de-interleaved parity-bit set in data stream 152 satisfies the constraints of the second modulation code and is typically longer than the corresponding (unconstrained) de-interleaved parity-bit set in data stream 142. In one embodiment, the second modulation code can be an MTR code.

Figure 2:
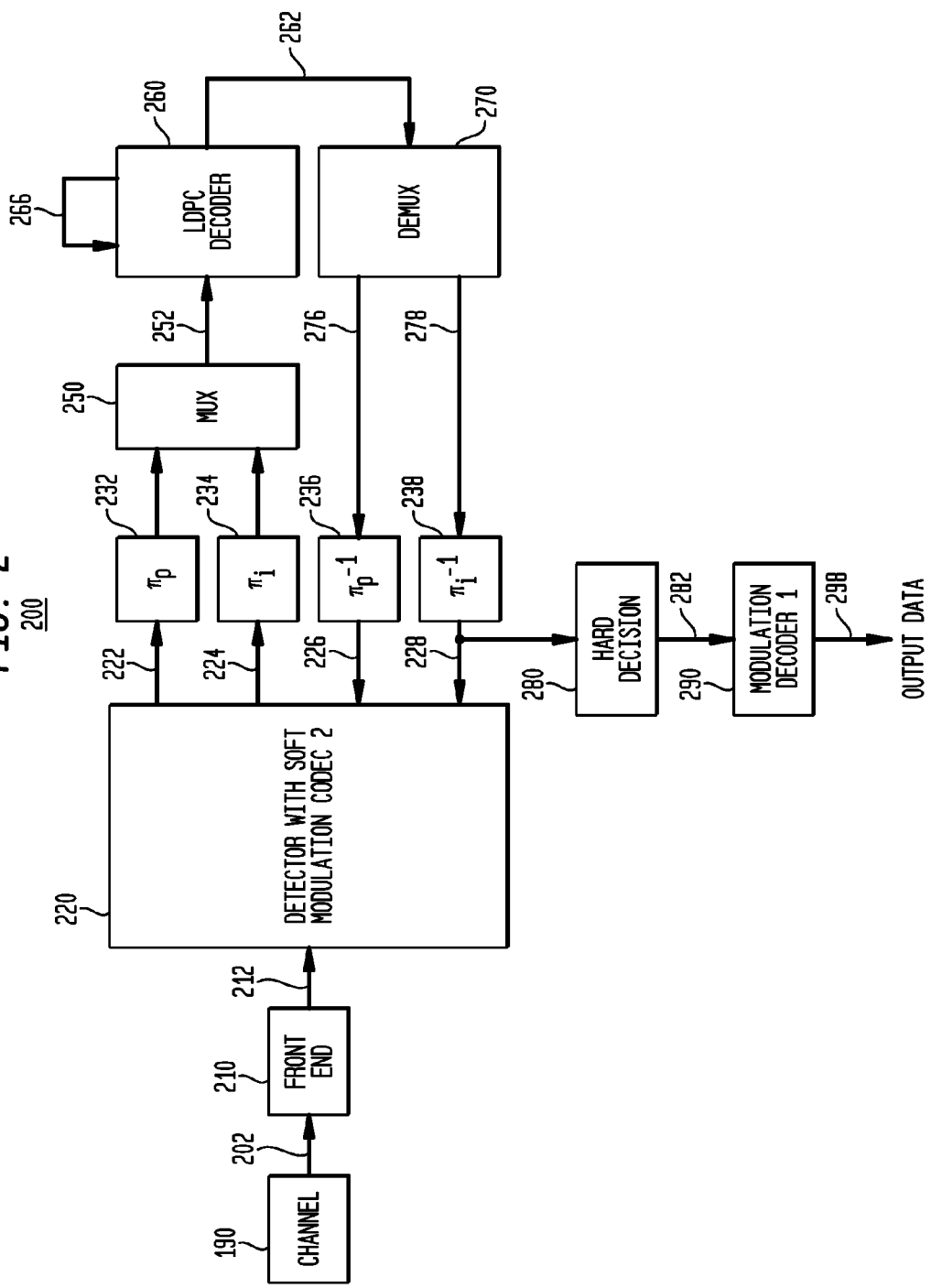
FIG. 2 shows a block diagram of a receiver according to an embodiment of the disclosure.

Multiplexer 160 is configured to multiplex data stream 112 and data stream 152 to generate a data stream 162 having codewords intended for transmission over channel 190 to a corresponding receiver, e.g., receiver 200 of FIG. 2. More specifically, multiplexer 160 is configured to generate each codeword for data stream 162 by concatenating a modulation-encoded word from data stream 112 and a corresponding modulation-encoded de-interleaved parity-bit set from data stream 152. The resulting parity/modulation-encoded codewords are concatenated to form data stream 162, which is then applied to a signal generator 170.

Signal generator 170 is configured to convert data stream 162 into output communication signal 188, which has a physical form suitable for application to channel 190. For example, in a non-return-to-zero-inverse (NRZI) magnetic-storage system, every digital "one" is represented by a magnetic-flux transition in a bit cell, and every digital "zero" is represented by a lack of a magnetic-flux transition in a bit cell. Accordingly, in this embodiment, signal generator 170 is configured to generate output communication signal 188 in a manner that induces, in the storage medium of channel 190, a magnetization reversal for every digital "one" in data stream 162 and a lack of magnetization reversal for every digital "zero" in the data stream. For alternative embodiments of channel 190, signal generator 170 can be similarly appropriately configured to generate other suitable physical forms of output communication signal 188.

FIG. 2 shows a block diagram of a receiver 200 according to an embodiment of the disclosure. Receiver 200 is illustratively shown as being configured to receive an input communication signal 202 from communication channel 190 and decode this signal to generate an output data stream 298. When input communication signal 202 corresponds to communication signal 188, in the absence of bit errors, output data stream 298 is a copy of data stream 102 (see FIG. 1). Note that communication channel 190 is not a part of receiver 200.

Receiver 200 has a front-end circuit 210 configured to receive communication signal 202 and convert this communication signal into an electrical digital signal 212 that is amenable to the subsequent digital-signal processing in the receiver. In one embodiment, front-end circuit 210 may include an analog-to-digital converter and a series of configurable filters, such as a continuous-time filter, a digital phase-lock loop, a waveform equalizer, and a noise-predictive finite-impulse-response equalizer (not explicitly shown in FIG. 2). The continuous-time filter operates to modify the frequency content of the digital signal generated by the analog-to-digital converter, e.g., to remove a dc component (if any) and attenuate certain frequencies dominated by noise or interference. The digital phase-lock loop operates to extract a clock signal that can then be used to more optimally sample communication signal 202 for processing. The waveform equalizer operates to adjust waveform shapes, e.g., to make them closer to optimal waveform shapes for which the downstream circuits are designed and/or calibrated. The noise-predictive finite-impulse-response equalizer operates to reduce the amount of data-dependent, correlated noise in the signal generated by the waveform equalizer.

Digital signal 212 generated by front-end circuit 210 is applied to a detector/codec module 220 that is configured to convert this signal into sets 222 and 224 of log-likelihood-ratio (LLR) values. More specifically, module 220 has a sequence detector (not explicitly shown in FIG. 2) that implements maximum-likelihood sequence estimation (MLSE) using a suitable MLSE algorithm, such as a log-MAP algorithm or a max-log-MAP algorithm. Module 220 also includes a soft-input/soft-output (SISO) modulation codec (not explicitly shown in FIG. 2) configured to use the second modulation code, which enables the sequence detector to take into account the modulation coding of parity bits implemented at the corresponding transmitter, such as in encoder 150 of transmitter 100 (FIG. 1). A more-detailed description of the processing implemented in module 220 is given below in reference to illustrative embodiments shown in FIGS. 3-11.

An important feature of the SISO modulation codec used in module 220 is that it is configured to operate on LLR values rather than on hard bit values, as is the case with conventional modulation codecs. As a result, LLR sets 222 and 224 generated by module 220 contain LLR values that represent the detector's confidence in the correctness of the estimated parity-encoded codewords after the modulation coding of parity bits has been taken into account. For each estimated parity-encoded codeword, LLR set 222 has LLR values representing the parity bits of the corresponding codeword, and LLR set 224 has LLR values representing the information bits of the codeword.

In a possible embodiment, an LLR value may comprise (i) a sign bit that represents the detector's best guess (hard decision) regarding the bit value encoded in signal 212 and (ii) one or more magnitude bits that represent the detector's confidence in the hard decision. For example, module 220 may be configured to output each LLR value as a five-bit value, where the most-significant bit is the sign bit and the four least-significant bits are the confidence bits. By way of example and without limitation, a five-bit LLR value of 00000 indicates a hard decision of 0 with minimum confidence, while a five-bit LLR value of 01111 indicates a hard decision of 0 with maximum confidence. Intermediate values (e.g., between 0000 and 1111) of confidence bits represent intermediate confidence levels. Similarly, a five-bit LLR value of 10001 indicates a hard decision of 1 with minimum confidence, while a five-bit LLR value of 11111 indicates a hard decision of 1 with maximum confidence, wherein the binary value of 10000 is unused. Other numbers of bits and other representations of confidence levels may alternatively be used as well.

Module 220 is coupled to a parity-check (e.g., LDPC) decoder 260 via a signal-processing path having two portions, one including interleavers 232 and 234 and multiplexer 250, and the other including de-multiplexer 270, and de-interleavers 236 and 238. Interleavers 232 and 234 and multiplexer 250 are located in the feed-forward path portion between module 220 and decoder 260. De-multiplexer 270 and de-interleavers 236 and 238 are located in the feedback path portion between decoder 260 and module 220. Each of interleavers 232 and 234, multiplexer 250, de-multiplexer 270, and de-interleavers 236 and 238 is configured to operate on sequences of LLR values. This characteristic of these elements is different from the corresponding characteristic of interleaver 120, de-interleaver 140, and multiplexer 160 in transmitter 100 (FIG. 1), each of which is configured to operate on (hard) bit sequences.

When receiver 200 is coupled to transmitter 100 (FIG. 1), interleavers 232 and 234, multiplexer 250, de-multiplexer 270, and de-interleavers 236 and 238 are configured to perform the following respective operations. Interleaver 232 is configured to perform interleaving operation $\pi_p$, which is an inverse of de-interleaving operation $\pi_p^{-1}$ performed by de-interleaver 140 in transmitter 100. Interleaver 234 is configured to perform interleaving operation $\pi_i$, which is the same interleaving operation as that performed by interleaver 120 in transmitter 100. De-interleaver 236 is configured to perform de-interleaving operation $\pi_p^{-1}$, which is (i) the same de-interleaving operation as that performed by de-interleaver 140 in transmitter 100 and (ii) an inverse of interleaving operation $\pi_p$, performed by interleaver 232. De-interleaver 238 is configured to perform de-interleaving operation $\pi_i^{-1}$, which is (i) an inverse of interleaving operation $\pi_i$ performed by interleaver 140 in transmitter 100 and (ii) an inverse of interleaving operation $\pi_i$ performed by interleaver 234. Multiplexer 250 is configured to perform a multiplexing operation that is analogous to that performed by multiplexer 160 in transmitter 100. De-multiplexer 270 is configured to perform a de-multiplexing operation that is an inverse of the multiplexing operation performed by multiplexer 250.

Decoder 260 is configured to decode a sequence 252 of LLR values received from multiplexer 250 in a conventional manner, e.g., using one or more local iterations indicated in FIG. 2 by a looped arrow 266 and, if necessary, one or more global iterations with module 220 using the above-mentioned feedback path portion having de-multiplexer 270 and de-interleavers 236 and 238. More specifically, for each LLR word from sequence 252, decoder 260 first attempts to converge on a valid parity-encoded (e.g., LDPC) codeword using local iterations 266. Local iterations 266 can be based, e.g., on a suitable message-passing or belief-propagation algorithm. Any valid parity-encoded codeword is characterized in that all its parity checks defined by the code's parity-check matrix are satisfied (e.g., produce zeros). Therefore, the convergence of local iterations 266 on a valid parity-encoded codeword can be determined, e.g., by configuring decoder 260 to calculate parity checks after each of said local iterations.

If decoder 260 fails to converge on a valid parity-encoded codeword after a specified maximum number of local iterations 266, then the decoding processing in the decoder is temporarily halted, and a corresponding global iteration is initiated by directing the signal processing back to detector 220. More specifically, for an LLR word from sequence 252 to which decoder 260 has applied the decoding processing, the decoder generates a modified LLR word 262. Modified LLR word 262 differs from the corresponding initial LLR word from sequence 252, e.g., because some of the sign-bit values and/or some of the confidence values may have been changed in the course of local iterations 266.

After being de-multiplexed in de-multiplexer 270 and de-interleaved in de-interleavers 236 and 238, modified LLR word 262 is converted into the corresponding LLR sets 226 and 228, which are directed back to detector 220. More specifically, LLR set 226 has LLR values corresponding to the parity bits of the parity-encoded codeword; and LLR set 228 has LLR values corresponding to the information bits of the parity-encoded codeword. Based on LLR sets 226 and 228, detector 220 regenerates LLR sets 222 and 224 and feeds them forward to decoder 260 for a next decoding attempt using local iterations 266.

If decoder 260 converges on a valid parity-encoded codeword, then LLR word 262 contains LLR values, wherein the sign-bit values express that parity-encoded codeword. De-multiplexer 270 de-multiplexes LLR word 262 into the corresponding LLR sets 276 and 278. De-interleaver 238 then applies de-interleaving operation $\pi_i^{-1}$ to LLR set 278 to convert it into the corresponding LLR set 228. A hard-decision filter 280 then removes the magnitude bits from LLR set 228, thereby transforming said LLR set into the corresponding modulation-encoded codeword 282. Finally, a modulation decoder 290 decodes modulation-encoded word 282 to recover the corresponding original information word and outputs the recovered original information word as part of output data stream 298. Note that the modulation decoding performed in modulation decoder 290 uses the first modulation code and is an inverse of the modulation encoding applied to the information bits at the corresponding transmitter, such as the modulation encoding performed in modulation encoder 110 of transmitter 100 (FIG. 1).

Figure 3:
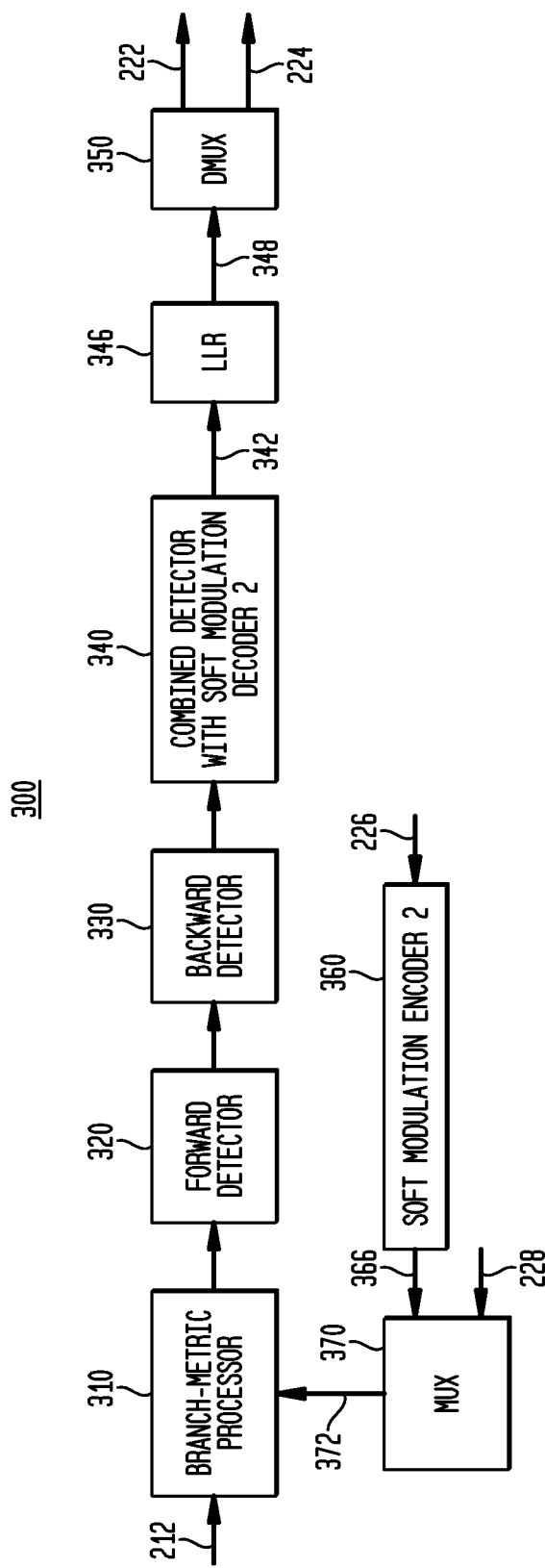
FIG. 3 shows a block diagram of a detector/codec module that can be used in the receiver of FIG. 2 according to an embodiment of the disclosure.

FIG. 3 shows a block diagram of a detector/codec module 300 that can be used as module 220 (FIG. 2) according to an embodiment of the disclosure. For illustration purposes, module 300 is shown in FIG. 3 as being configured to receive digital signal 212 and LLR sets 226 and 228 and to generate LLR sets 222 and 224. When used in a circuit other than receiver 200, module 300 can be configured to receive/generate other appropriate signals.

In one embodiment, front-end circuit 210 (FIG. 2) is configured to generate digital signal 212 such that this signal contains one digital sample per bit. Typically, the digital samples are adversely affected by a relatively low signal-to-noise ratio of input communication signal 202 (FIG. 2) and are further adversely affected by inter-symbol interference (ISI). Module 300 includes circuitry that operates as a soft-output channel detector configured to unravel the effects of ISI by treating each possible combination of binary symbols using states in a trellis. For example, for a magnetic recording channel, a 16-state trellis (where each state represents a respective four-bit value) can be used to achieve adequate performance characteristics. In various alternative embodiments, other trellises can similarly be used.

Module 300 further includes circuitry that operates to generate LLR sets 222 and 224 in a manner that takes into account the inter-bit correlations imposed by the second modulation code. In one embodiment, module 300 is configured to generate LLR sets 222 and 224 after these inter-bit correlations have been taken into account, which causes LLR set 222 not to contain LLR values corresponding to the parity bits introduced by the second modulation code. This property of module 300 means that the module also operates as a soft-output modulation decoder with respect to the second modulation code.

Module 300 includes a feed-forward path and a feedback path. The feed-forward path comprises a branch-metric processor 310, a forward detector 320, a backward detector 330, a combined-detector/decoder module 340, an LLR calculator 346, and a de-multiplexer 350. The feedback path comprises a soft modulation encoder 360 and a multiplexer 370. In one embodiment, the constituent elements of the feed-forward and feedback paths in module 300 are designed to enable a continuous pipelined data flow therethrough in accordance with a sliding-window log-MAP algorithm described, e.g., in (i) A. J. Viterbi,"An Intuitive Justification and a Simplified Implementation of the MAP decoder for Convolutional Codes," IEEE J. Select. Areas Commun., vol. 16, pp. 260-264, February 1998, and (ii) S. M. Karim, et al., "A Pipelined Architecture for High Throughput Efficient Turbo Decoder," Special Issue of International Journal of Computer Applications on Electronics, Information and Communication Engineering, ICEICE, No. 1, pp. 12-16, December 2011, both of which are incorporated herein by reference in their entirety.

Figure 4:
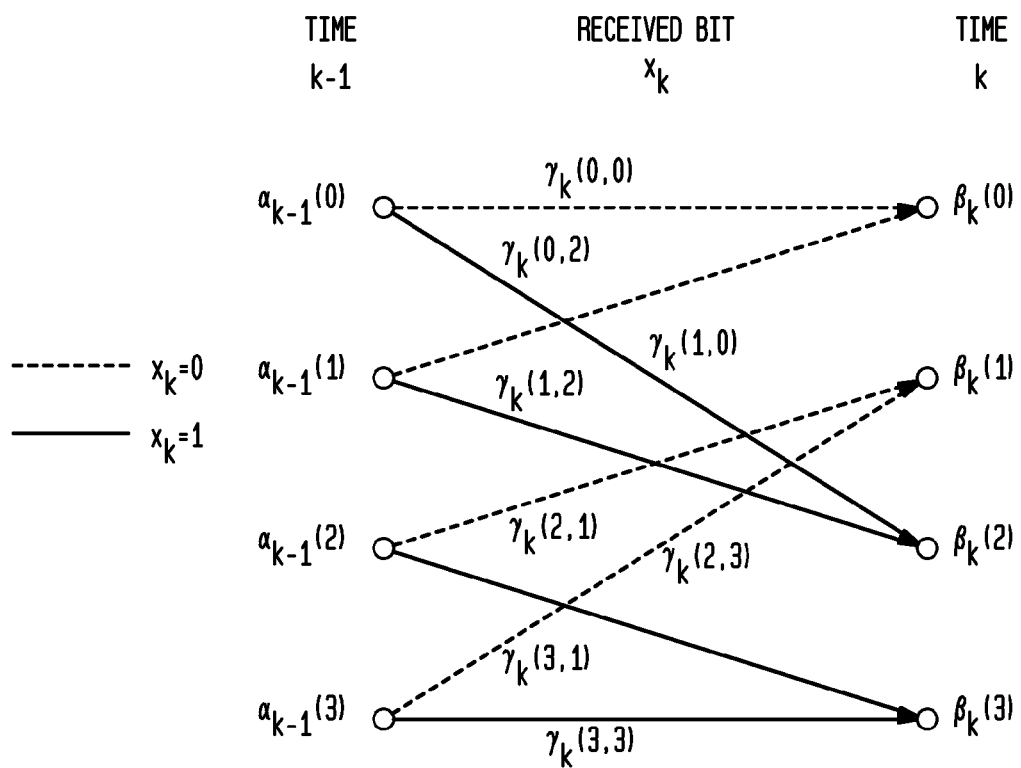
FIG. 4 shows a representative full-rate trellis on which the signal processing implemented in the detector/codec module of FIG. 3 can be based according to an embodiment of the disclosure.

FIG. 4 shows a representative full-rate trellis 400 on which the signal processing implemented in module 300 can be based according to an embodiment of the disclosure. Trellis 400 is a four-state trellis, with each time node of the trellis having the set of states labeled (0), (1), (2), and (3). A received bit $x_k$ causes a transition from a state s' (=(0), (1), (2), or (3)) located at time (k−1) to a state s (=(0), (1), (2), or (3)) located at time k. For a given state s', the next state s depends on the value of $x_k$, as indicated by the dashed and solid arrows in FIG. 4. Also shown in FIG. 4 are the various metrics associated with the shown two time nodes of trellis 400, wherein: $\gamma_k(s',s)$ is the branch metric corresponding to the transition from trellis state s' to trellis state s; $\alpha_{k-1}(s')$ is the forward state metric corresponding to trellis state s'; and $\beta_k(s)$ is the backward state metric corresponding to trellis state s. One of ordinary skill in the art will appreciate that the metrics shown in FIG. 4 and similar metrics corresponding to other time nodes of the trellis can be combined and/or manipulated to generate various additional metrics, such as metrics corresponding to various possible paths through the trellis that span more than two time nodes and include more than one transition.

Figure 5:
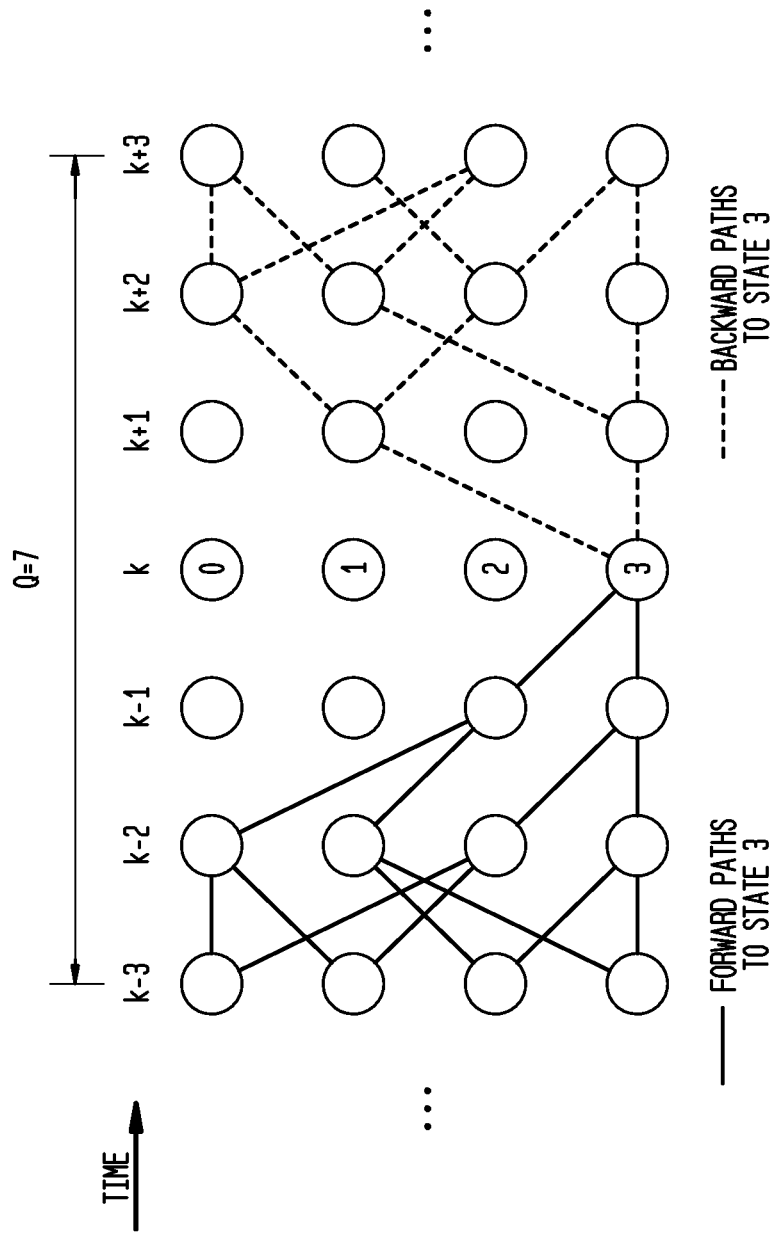
FIG. 5 illustrates a method of generating log-likelihood-ratio (LLR) values that can be implemented in the detector/codec module of FIG. 3 according to an embodiment of the disclosure.

FIG. 5 illustrates a method of generating LLR values for LLR sets 222 and 224 corresponding to trellis 400 in an embodiment where module 300 is configured to employ a log-MAP algorithm having a sliding-window width (Q) of seven time nodes of the trellis. One of ordinary skill in the art will appreciate that LLR computations corresponding to a different trellis (e.g., a 16-state trellis) and/or a different sliding-window width can be performed in a manner analogous to that illustrated in FIG. 5 in alternative embodiments of module 300, such as those described below in reference to FIGS. 8 and 9.

The method of generating LLR values illustrated by FIG. 5 is based on the notion that the complete sequence y of signal samples $y_i$ supplied to module 300 via signal 212 and located within the sliding window of the operative log-MAP algorithm can be divided into three subsequences: one representing the past time, another one representing the present time, and yet another one representing the future time, e.g., as follows:

$$y = y_1 y_2 \ldots y_{k-1} y_k y_{k+1} \ldots y_Q = y_{<k} y_k y_{>k} \quad (1)$$

where k is the present time; Q is the width of the sliding window of the log-MAP algorithm; $y_{<k} \equiv y_1 y_2 \ldots y_{k-1}$ is the past subsequence; and $y_{>k} \equiv y_{k+1} y_{k+2} \ldots y_Q$ is the future subsequence. For a memoryless channel, the joint probability of receiving the Q-bit sequence y and being in trellis state s' at time (k−1) and in trellis state s at the current time k can be computed using forward state metrics $\alpha_{k-1}(s')$, branch metrics $\gamma_k(s',s)$, and backward state metrics $\beta_k(s)$ (also see FIG. 4) corresponding to the various valid paths through the trellis that have branches converging on and stemming from state s. The LLR value(s) corresponding to signal samples $y_k$ can then be computed based on said joint probability.

FIG. 5 shows a set of valid paths through trellis 400 (see FIG. 4) that traverse state (3) of the trellis at time k. Each such path begins at a state of the trellis located at time (k−3) and ends at a state of the trellis located at time (k+3). The forward paths converging on state (3) correspond to past subsequence $y_{<k}$ and are shown in FIG. 5 by the solid lines. The backward paths stemming from state (3) correspond to future subsequence $y_{>k}$ and are shown in FIG. 5 by the dashed lines.

The practical utility of the trellis-paths partition illustrated in FIG. 5 stems from the fact that $\alpha_{k-1}(s')$ can be recursively calculated over past subsequence $y_{<k}$, while $\beta_k(s)$ can be recursively calculated over future subsequence $y_{>k}$, e.g., as follows:

$$\alpha_{i+1}(s) = \max_{s'}{}^* [\alpha_i(s') + \gamma_i(s', s)] \quad (2)$$

$$\beta_{i-1}(s') = \max_{s}{}^* [\beta_i(s) + \gamma_i(s', s)] \quad (3)$$

where max* is the Jacobi logarithm taken over the finite field defined in the underscript. The recursions given by Eqs. (2) and (3) can be appropriately initialized, as known in the art, e.g., using bit padding at the start and the end of the codeword, which forces the encoder into a known state at either end of the transmitted codeword, thereby defining the initial state for each of the recursions performed at the receiver.

Although FIG. 5 shows a partition of the paths in which subsequences $y_{<k}$ and $y_{>k}$ have equal lengths, embodiments of the disclosure are not so limited. For example, in one embodiment, the length ($Q_{>k}$) of future subsequence $y_{>k}$ can be different from the length ($Q_{<k}$) of past subsequence $y_{<k}$, where $Q=Q_{>k}+Q_{<k}+1$. The value of $Q_{>k}$ is sometimes referred to in the literature as the look-ahead period. For many applications, the look-ahead period of about eight is sufficient for module 300 to achieve acceptable BER characteristics. In some embodiments, $Q_{>k} > Q_{<k}$ by at least a factor of two. For processing codewords consisting of non-binary symbols, module 300 may also be designed so that different bits of a non-binary symbol are processed using different respective look-ahead periods.

As known in the art, a non-binary codeword consists of symbols selected from a constellation comprising a plurality of (usually more than two) symbols. For purposes of generalization, a binary codeword can be considered to be a specific case of a non-binary codeword generated using a constellation consisting of only two symbols, e.g., a binary "one" and a binary "zero." However, as used in this specification and the appended claims, the term "non-binary" should be construed to be limited to codewords that are generated using a constellation consisting of more than two constellation symbols.

Referring back to FIG. 3, branch-metric processor 310 in module 300 is configured to generate branch metrics $\gamma_k(s',s)$ and send them down the feed-forward path to forward detector 320, backward detector 330, combined-detector/decoder module 340, and LLR calculator 346. For the initial iteration between module 300 and the corresponding LDPC decoder (such as LDPC decoder 260 in FIG. 2), branch-metric processor 310 generates branch metrics $\gamma_k(s',s)$ for all possible transitions between time nodes (k−1) and k solely based on the corresponding signal sample $y_i$ and the operative trellis (such as trellis 400, FIG. 4) as soon as said signal sample is received via signal 212. For any subsequent iteration between module 300 and the corresponding LDPC decoder, branch-metric processor 310 generates branch metrics $\gamma_k(s',s)$ based on signal samples $y_i$ and the corresponding LLR value(s) 372 that it receives via the feedback path. For example, in one embodiment, branch-metric processor 310 can be configured to generate branch metrics $\gamma_k(s',s)$ while treating feedback LLR value(s) 372 as extrinsic or a priori information, e.g., as described in U.S. Patent Application Publication No. 2009/0185643, which is incorporated herein by reference in its entirety. The mathematical equations that can be used to implement the process of generating branch metrics $\gamma_k(s',s)$ in branch-metric processor 310 are also provided, e.g., in (i) M. A. Khalighi, "Effect of Mismatched SNR on the Performance of Log-MAP Turbo Detector," IEEE Transactions on Vehicular Technology, v. 52, No. 5, pp. 1386-1397, September 2003, and (ii) the above-cited paper by S. M. Karim, et al. The just-mentioned paper by M. A. Khalighi is incorporated herein by reference in its entirety.

Forward detector 320 is configured to recursively calculate forward state metrics for the paths proceeding through the trellis in the forward direction. For example, in one embodiment, forward detector 320 can be configured to calculate a forward state metric for a state at time node k in accordance with Eq. (2) and based on (i) the corresponding forward state metric previously calculated for time node (k−1) and (ii) the corresponding branch metric received from branch-metric processor 310. For each state at time node k, forward detector 320 calculates two forward state metrics associated with the two branches leading to that state in the forward direction. Forward detector 320 then compares the two calculated forward state metrics and selects one of them, for example, the smaller one, as the forward state metric associated with that state for further use in the recursive calculations and in combined-detector/decoder module 340. An exemplary add/compare/select (ACS) circuit that can be used to implement this processing in forward detector 320 is disclosed, e.g., in U.S. Patent Application Publication No. 2008/0240303, which is incorporated herein by reference in its entirety.

Backward detector 330 is configured to recursively calculate backward state metrics for the paths that lead to the states at time node k but proceed through the trellis in the backward direction. For example, in one embodiment, backward detector 330 can be configured to calculate a backward state metric for a state at time node k in accordance with Eq. (3) and based on (i) the corresponding backward state metric previously calculated for time node (k+1) and (ii) the corresponding branch metric received from branch-metric processor 310. For each state at time node k, backward detector 330 calculates two backward state metrics associated with the two branches leading to that state in the backward direction. Backward detector 330 then compares the two calculated backward state metrics and selects one of them, for example, the smaller one, as the backward state metric associated with that state for further use in the recursive calculations and in combined-detector/decoder module 340. In one embodiment, to enable appropriate inputs to the backward recursions, backward detector 330 may use one or more LIFO buffers configured to buffer the branch metrics received from branch-metric processor 310 for at least the entire look-ahead period. Since a backward recursion does not begin until the corresponding LIFO buffer fills up, the processing performed in backward detector 330 lags behind the processing implemented in forward detector 320. An exemplary ACS circuit that can be used to implement the backward-path processing in backward detector 330 is disclosed, e.g., in the above-cited U.S. Patent Application Publication No. 2008/0240303. Additional logic circuits that can be used to implement backward detector 330 are disclosed, e.g., in the above-cited U.S. Patent Application Publication No. 2009/0185643. An additional embodiment of backward detector 330 is described in more detail below in reference to FIG. 8.

Combined-detector/decoder module 340 is configured to combine and manipulate the various metrics generated by branch-metric processor 310, forward detector 320, and backward detector 330 to determine a set of most probable paths through the time nodes of the operative trellis that are currently located within the sliding window of the log-MAP algorithm employed in module 300. Combined-detector/decoder module 340 is further configured to (i) filter the various combined metrics generated therein to take into account the inter-symbol correlations imposed by the second modulation code and (ii) provide the resulting filtered sets 342 of combined metrics to LLR calculator 346. This filtering function of module 340 substantially enables it to operate as a soft-output modulation decoder with respect to the second modulation code, in addition to operating as a combined detector. Note that the term "combined detector," as used in the pertinent literature, usually refers to a processing unit of a channel detector that is configured to appropriately combine (e.g., using the above-mentioned ACS processing) the branch metrics, forward state metrics, and backward state metrics received from the corresponding upstream circuits, such as the corresponding branch-metric processor, forward detector, and backward detector. However, as used herein, the term "combined detector" refers to a functionality that is somewhat different from that of a conventional combined detector because module 340 is configured to combine and manipulate the various received metrics in a manner that enables module 340 to also perform the above-indicated filtering function. An embodiment of module 340 is described in more detail below in reference to FIG. 9.

LLR calculator 346 is configured to calculate LLR values 348 based on filtered sets 342 of combined metrics received from combined-detector/decoder module 340. Filtered sets 342 generally cause LLR calculator 346 to generate fewer LLR values than there are signal samples in input signal 212. For example, in one embodiment, when the second modulation code has a rate of r/(r+1), filtered sets 342 cause LLR calculator 346 to output r LLR values 348 per (r+1) signal samples $y_i$. In contrast, an LLR-calculation unit of a conventional channel detector operates to output exactly one LLR value per signal sample when the detector's front end is configured to provide one signal sample per bit.

For illustration purposes and without any inferred limitation, the functionality of module 300 and its constituent circuits is described below in reference to (i) a non-return-to-zero (NRZ) magnetic-storage system and (ii) the second modulation code being an MTR(r) code, where r is a positive integer representing the code's constraint. From the provided description, one of ordinary skill in the art will be able to make and use alternative embodiments, in which (i) the signals received by module 300 correspond to a communication channel different from that of an NRZ magnetic-storage system and (ii) the second modulation code is different from an MTR(r) code.

In an NRZ magnetic-storage system, "zeros" and "ones" are represented by opposite directions of the magnetization. Flux reversals occur only at mid-cells or, in some embodiments, at cell boundaries. An absence of a flux reversal means that the next magnetic cell stores the same bit value as the preceding magnetic cell.

In one embodiment, an MTR(r) code operates as follows. To encode a bit set of length p, the bit set is first partitioned into subsets of length r, where r<p. Then, each r-bit subset is replaced by a corresponding (r+1)-bit subset. For an NRZ magnetic-storage system, the (r+1)-bit subset differs from the source r-bit subset only in the extra (r+1)-th bit, which is appended to the r-bit subset and is a duplicate of the r-th bit from the r-bit subset. In mathematical terms, if the initial p-bit set is $(a_1, a_2, \ldots a_p)$, then the corresponding MTR(r)-encoded bit set is $(a_1, a_2, \ldots, a_r, a_r, a_{r+1}, a_{r+2}, \ldots, a_{2r}, a_{2r}, a_{2r+1}, \ldots, a_p)$.

In one embodiment, module 340 and LLR calculator 346 are configured to (i) generate an initial sequence of LLR values that has one LLR value per signal sample $y_i$ and (ii) apply soft MTR decoding, using the MTR(r) code, to the subsequences of the generated initial sequence corresponding to the parity bits, to which the MTR(r) code was applied by the transmitter.

In one embodiment, the step of generating an initial sequence of LLR values can be implemented using a suitable variant of a conventional log-MAP algorithm, such as one of those disclosed in (i) International Patent Application Publication No. WO 2005/081410, (ii) the paper by Silvio A. Abrantes, entitled "From BCJR to turbo decoding: MAP algorithms made easier," © Silvio A. Abrantes, April 2004, (iii) U.S. Patent Application Publication No. 2009/0319862, (iv) U.S. Pat. No. 7,757,151, (v) the paper by M. Lopez-Vallejo, et al., entitled "A Low-Power Architecture for Maximum a Posteriori Decoding," Conference Record of the Thirty-Sixth Asilomar Conference on Signals, Systems and Computers, 3-6 Nov., 2002, vol. 1, pp. 47-51, all of which are incorporated herein by reference in their entirety.

Then, the step of applying soft MTR decoding to the subsequences of the generated initial sequence can be implemented, for example, as follows.

For binary codewords, the soft MTR decoding is performed in the following manner.

Let a pertinent LLR subsequence have the following $p_1$ LLR values: $(L_1, L_2, \ldots, L_r, L_{r+1}, L_{r+2}, \ldots, L_{2r+1}, L_{2r+2}, L_{2r+3}, \ldots, L_{p1})$, where $p_1/(r+1)=p/r$. Then, after the soft MTR decoding, the corresponding MTR-decoded LLR subsequence has the following p LLR values: $(L_1, L_2, \ldots, L_r, L_{r+2}, \ldots, L_{2r+1}, L_{2r+3}, \ldots, L_{p1})$ For non-binary codewords, the soft MTR decoding is performed in the following manner.

Let us assume that the constellation of available constellation symbols consists of $2^m$ symbols u, where m is a positive integer greater than one. This means that each constellation symbol u can be represented by a bit block consisting of m bits. A sequence of N constellation symbols u is therefore represented by a corresponding sequence having N×m bits. When an MTR(r) code is applied to this sequence, it inserts into it one MTR bit per r original bits. Depending on the concrete values of m and r, a situation is possible in which different bit blocks representing different respective constellation symbols u receive different numbers of MTR bits (if any).

Figure 6:
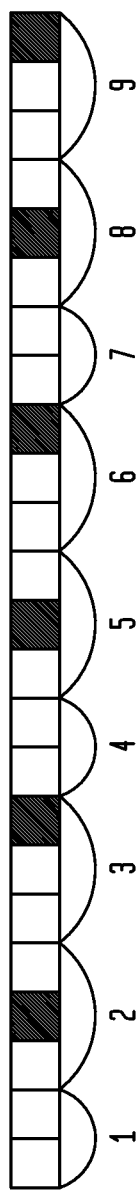
FIG. 6 illustrates a possible structure of an LLR set corresponding to a modulation-encoded bit sequence processed in the detector/codec module shown in FIG. 3 according to an embodiment of the disclosure.

FIG. 6 shows an example corresponding to m=2 and r=3. More specifically, FIG. 6 shows an MTR-encoded bit sequence 600 having nine two-bit constellation symbols u labeled 1-9. Each two-bit constellation symbol u is represented in sequence 600 by two corresponding symbol bits shown in FIG. 6 as unfilled squares. The MTR(3) encoding has added one MTR bit per three symbol bits, which has inserted additional bits into some, but not all, of the nine two-bit constellation symbols u, as indicated by the filled squares in FIG. 6, with each filled square representing a respective MTR bit. For example, each of the first, fourth, and seventh constellation symbols u in sequence 600 does not have an MTR bit. In contrast, each of the second, fifth, sixth, eighth, and ninth constellation symbols u in sequence 600 does have an MTR bit. Also note that the MTR bit can be either located between the two symbol bits or appended after the two symbol bits.

In general, certain LLR subsequences in the sequence of initial LLR values generated in the above-mentioned step of generating the initial sequence of LLR values have a property similar to that of sequence 600. Namely, some LLR blocks representing constellation symbols u do not have any LLR values corresponding to MTR bits while other LLR blocks do have such LLR values. To take this characteristic into account, module 340 and LLR calculator 346 are configured to use different respective processing paths for soft MTR decoding the LLR blocks that have and do not have an LLR value corresponding to an MTR bit.

In one embodiment, for an LLR block not having an LLR value corresponding to an MTR bit (such as that corresponding to the first constellation symbol u in sequence 600), module 340 and LLR calculator 346 are configured to calculate LLR values 348 using a processing path that implements Eq. (4):

$$L_i(u) = \max_{P \in \Delta^i_{l,m}}{}^* [\alpha_l(b(P)) + \gamma_l(P) + \beta_{l+m}(e(P))] - \max_{P \in \Delta^0_{l,m}}{}^* [\alpha_l(b(P)) + \gamma_l(P) + \beta_{l+m}(e(P))] \quad (4)$$

with the various symbols in this equation denoting the following quantities:

- $L_i(u)$ an i-th LLR value corresponding to constellation symbol u. For an m-bit constellation symbol u, there are $2^m$ LLR values. By convention, $L_0(u)=0$;
- i an index pointing at different possible values (constellation points) for constellation symbol u, where $i \in \{0, 1, 2, \ldots, 2^m-1\}$;
- max* the Jacobi logarithm taken over the finite field defined in the underscript;
- P a path through the operative trellis, such as one of the paths through trellis 400 shown in FIG. 5;
- $\Delta^i_{l,m}$ a set of paths P defined as $\Delta^i_{l,m} = \{P=(s_0,s_1), (s_1,s_2), \ldots, (s_{m-1},s_m): s_j \in S_{l+j}; j \in \{0,1,2,\ldots,m\}; n(P)=i\}$, where $(s_k, s_{k+1})$ denotes a branch that connects states in two adjacent time nodes in the trellis; $S_{l+j}$ is the set of states at time node (l+j); l is an index pointing at the position corresponding to the first bit of symbol u; and n(P) is a topological metric of path P. More specifically, regarding n(P), it should be noted that in the trellis of a log-MAP algorithm, each branch leaving a state in the trellis can be assigned a value that depends on the state that the branch connects to. The sequence of these values describing path P and interpreted as an integer is n(P);
- b(P) the state at which path P begins. For example, for the paths shown in FIG. 5, such state is the corresponding one of the states at time node (k−3);
- e(P) the state at which path P ends. For example, for the paths shown in FIG. 5, such state is the corresponding one of the states at time node (k+3);
- $\alpha_l(b(P))$ the forward state metric for state b(P);
- $\beta_{l+m}(e(P))$ the backward state metric for state e(P); and
- $\gamma_l(P)$ the branch metric of path P, which is calculated as $$\gamma_l(P) = \sum_{i=0}^{m-1} \gamma_{l+i}(s_i, s_{i+1}),$$

where $$\gamma_{l+i}(s_i, s_{i+1})$$

is the branch metric of the branch in path P that connects state $s_i$ to state $s_{i+1}$.

For an LLR block having an LLR value corresponding to an MTR bit (such as that corresponding to the second or third constellation symbol u in sequence 600), module 340 and LLR calculator 346 are configured to calculate LLR values 348 using a processing path that implements Eq. (5):

$$L_i(u) = \max_{P \in \Delta^{w(i,q)}_{l,m+1}}{}^* [\alpha_l(b(P)) + \gamma_l(P) + \beta_{l+m+1}(e(P))] - \max_{P \in \Delta^0_{l,m+1}}{}^* [\alpha_l(b(P)) + \gamma_l(P) + \beta_{l+m+1}(e(P))] \quad (5)$$

Most of the symbols used in Eq. (5) are already explained above in reference to Eq. (4). An index change in the β terms of Eq. (5) compared to the β terms of Eq. (4) is self-explanatory. The finite field in the underscript of the Jacobi logarithms has the following new quantity:

- w(i,q) an (m+1)-bit value in which the q-th bit of i is repeated. More specifically, if the m-bit value $i=a_0a_1 \ldots a_qa_{q+1} \ldots a_{m-1}$, then $w(i,q)=a_0a_1 \ldots a_qa_qa_{q+1} \ldots a_{m-1}$. Also note, that branch metric $\gamma_l(P)$ in Eq. (5) is calculated over a longer path P, which now contains m+1 states instead of m.

DMUX 350 is configured to de-multiplex LLR values 348 generated by LLR calculator 346 into the corresponding LLR sets 222 and 224. As indicated above, LLR set 222 has LLR values representing the parity bits of the corresponding codeword while LLR set 224 has LLR values representing the information bits of the codeword.

The feedback path in module 300 is used when the corresponding LDPC decoder (such as LDPC decoder 260 in FIG. 2) requests a next iteration by sending a modified LLR word 262 back to module 300. After being processed in de-multiplexer 270 and de-interleavers 236 and 238, LLR word 262 is presented to module 300 in the form of LLR sets 226 and 228.

Soft modulation encoder 360 is a SISO modulation encoder configured to apply soft MTR encoding, using the MTR(r) code, to LLR set 226 corresponding to the LLR word 262. As a result, soft modulation encoder 360 transforms LLR set 226 into a corresponding MTR-encoded LLR set 366.

For binary codewords, soft modulation encoder 360 can be configured to perform the soft MTR encoding, for example, in the following manner.

Let LLR set 226 have the following LLR values: $L_1, L_2, \ldots, L_r, L_{r+1}, L_{r+2}, \ldots, L_{2r}, L_{2r+1}, L_{2r+2}, \ldots, L_p$). Then, after the soft MTR encoding, the corresponding LLR set 366 has the following LLR values: $L_1, L_2, \ldots, L_r, L_r, L_{r+1}, L_{r+2}, \ldots, L_{2r}, L_{2r}, L_{2r+1}, L_{2r+2}, \ldots, L_p$).

For non-binary codewords, soft modulation encoder 360 can be configured to perform the soft MTR encoding, for example, in the following manner.

If, for each m-bit constellation symbol u, LLR set 226 has $M=2^m-1$ LLR values $(L_1, L_2, \ldots, L_M)$, then the corresponding LLR set 366 has the following LLR values $(L'_1, L'_2, \ldots, L'_r, L'_r, L'_{r+1}, L'_{r+2}, \ldots, L'_{2r}, L'_{2r}, L'_{2r+1}, L'_{2r+2}, \ldots, L'_p)$, where the various L' values are the LLR values corresponding to the individual bits of constellation symbol u.

In one embodiment, soft modulation encoder 360 is configured to calculate LLR values $L'_i$ using a processing path that implements Eq. (4):

$$L'_i = \max_{j \in \Omega^1_i}{}^* L_j(u) - \max_{j \in \Omega^0_i}{}^* L_j(u) \quad (6)$$

with the various symbols in this equation denoting the following quantities:

$L_j(u)$ the j-th LLR value corresponding to constellation symbol u. For an m-bit constellation symbol u, there are $2^m$ LLR values. By convention, $L_0(u)=0$;

i an index pointing at different individual bits of constellation symbol u, where $i \in \{0, 1, 2, \ldots, m-1\}$;

j an index pointing at different possible values for constellation symbol u, where $j \in \{0, 1, 2, \ldots, 2^m-1\}$; and $\Omega^q_i$ a set of values defined as $\Omega^q_i = \{j: V(j,i) = q\}$, where $V(j,i) = (j/2^i) \mod 2$, and q is either 0 or 1. Note that function $V(j,i)$ returns the value of the i-th bit of j.

Multiplexer 370 is configured to multiplex LLR sets 366 and 228 to generate a corresponding LLR set 372. As indicated above, LLR values from LLR set 372 are used in branch-metric processor 310 as extrinsic or a priori information in the process of (re)generating branch metrics $\gamma_k(s',s)$.

FIGS. 7A-7G show a library 700 of circuit elements that can be used to implement detector/codec module 300 (FIG. 3) according to an embodiment of the disclosure. One of ordinary skill in the art will understand how to make and use additional logic elements, e.g., by modifying some of the inputs to the logic elements shown in FIGS. 7A-7G. Some of such additional logic elements are used in and described in more detail in reference to the circuits shown in FIGS. 8 and 9.

Library 700 is generally designed for a detector/codec module 300 configured to operate based on a 16-state trellis, wherein each state has four bits (which, in the absence of errors, can be interpreted, e.g., as the four previously received bits $[x_{k-1} \, x_{k-2} \, x_{k-3} \, x_{k-4}]$). A received bit $x_k$ causes a transition from the state $[x_{k-1} \, x_{k-2} \, x_{k-3} \, x_{k-4}]$ located at time node (k−1) to the state $[x_k \, x_{k-1} \, x_{k-2} \, x_{k-3}]$ located at time node k. Since $x_k$ can be a binary "one" or a binary "zero," there are two transition branches from each possible state $[x_{k-1} \, x_{k-2} \, x_{k-3} \, x_{k-4}]$, for a total of thirty-two possible transition branches between the time nodes (k−1) and k in the 16-state trellis.

In a pipelined architecture, it is convenient to describe the signal processing in the processing paths thereof in reference to the current time at some reference point within the pipeline, as opposed to the absolute time. Hence, in the corresponding "pipelined" notation, the various binary symbols u, currently in the pipeline, are designated using letters of the English alphabet in a manner that reflects the relative positions of the binary symbols in the pipeline. As an example, let us consider a sequence of binary symbols ($u_0 \, u_1 \, u_2$ to $u_4 \, u_5$), wherein the subscript value indicates the absolute time at which each of the binary symbols was received at the front end of the pipeline. Then, the pipelined notation for these binary symbols is derived as follows.

At absolute time t=0, the sequence has a single binary symbol, $u_0$, because the other five binary symbols of the sequence have not been received yet. In the pipelined notation, the "freshest" binary symbol is designated by the letter "a." Thus, at absolute time t=0, the letter "a" refers to binary symbol $u_0$.

At absolute time t=1, binary symbol $u_1$ is received. The sequence now has binary symbols $u_0$ and $u_1$. Since $u_1$ is now the "freshest" binary symbol, binary symbol $u_1$ is designated by the letter "a." Since binary symbol $u_0$ moved down the pipeline by one time slot (e.g., to the second stage of the pipeline), binary symbol $u_0$ is now designated by the letter "b." Thus, at absolute time t=1, the letter "a" refers to binary symbol $u_1$, and the letter "b" refers to binary symbol $u_0$.

At absolute time t=2, binary symbol $u_2$ is received. The sequence now has binary symbols $u_0$, $u_1$, and $u_2$. Since $u_2$ is now the "freshest" binary symbol, binary symbol $u_2$ is designated by the letter "a." Since binary symbol $u_1$ moved down the pipeline by one time slot (e.g., to the second stage of the pipeline), binary symbol $u_1$ is now designated by the letter "b." Since binary symbol $u_0$ moved further down the pipeline by one time slot (e.g., to the third stage of the pipeline), binary symbol $u_0$ is now designated by the letter "c." Thus, at absolute time t=2, the letter "a" refers to binary symbol $u_2$; the letter "b" refers to binary symbol $u_1$; and the letter "c" refers to binary symbol $u_0$.

As time goes on and the binary symbols move along the pipeline, the above-described letter reassignment progresses in a similar manner. For example, at absolute time t=3, the letters "a," "b," "c," and "d" refer to binary symbols to, $u_2$, $u_1$, and $u_0$, respectively. At absolute time t=4, the letters "a," "b," "c," "d," and "e" refer to binary symbols $u_4$, to, $u_2$, $u_1$, and $u_0$, respectively. Finally, at absolute time t=5, the letters "a," "b," "c," "d," "e," and "f" refer to binary symbols $u_5$, $u_4$, $u_3$, $u_2$, $u_1$, and $u_0$, respectively.

For a pipeline that accommodates more than twenty-six full-rate clock cycles, the letters used in the description are recycled. For example, in such a pipeline, at absolute time t=26, both binary symbols $u_{26}$ and $u_0$ are designated by the same letter "a." However, this nomenclatorial ambiguity can generally be resolved in a relatively straightforward manner from the context in which the corresponding circuit element appears in the pipeline structure, for example, because the letter "a" corresponding to binary symbol $u_{26}$ appears in the description of the circuit element(s) located relatively close to the front end of the pipeline, whereas the letter "a" corresponding to binary symbol $u_0$ appears in the description of the circuit element(s) located significantly further down the pipeline. In addition, a recycled letter "a" typically appears next to the letters "x," "y," and/or "z" from the preceding alphabetic set of letters. In the embodiment of detector/codec module 300 described below in reference to FIGS. 8 and 9, the length of the pipeline is such that some of the letters may need to be recycled up to three times.

Figure 7A:
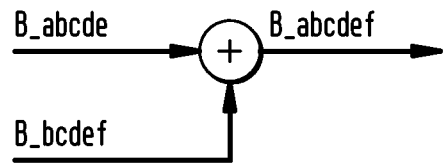
FIGS. 7A-7G show a library of logic elements that can be used to implement the detector/codec module of FIG. 3 according to an embodiment of the disclosure.

FIG. 7A shows a circuit symbol for an add element 702. Add element 702 is shown as being configured to calculate a set B_abcdef of double-transition branch metrics based on the sets B_abcde and B_bcdef of the corresponding regular (single-transition) branch metrics, where each of the lower-case letters represents a pipelined binary symbol as described above. More specifically, set B_abcde consists of the thirty-two branch metrics corresponding to the thirty-two branches in the sixteen-state trellis, each connecting a state [bcde] to a state [abed]. Similarly, set B_bcdef consists of the thirty-two branch metrics corresponding to the thirty-two branches in the sixteen-state trellis, each connecting a state [cdef] to a state [bcde]. In mathematical terms, sets B_abcde, B_bcdef, and B_abcdef are expressed by Eqs. (7a-7c):

$$B\_abcde = \{\gamma(s',s): s = [abed]; s' = [bcde]; a,b,c,d,e \in \{0,1\}\} \quad (7a)$$

$$B\_bcdef = \{\gamma(s'',s'): s' = [bcde]; s'' = [cdef]; b,c,d,e,f \in \{0,1\}\} \quad (7b)$$

$$B\_abcdef = \{\gamma(s'',s) \cdot \gamma(s'',s) = \gamma(s',s) + \gamma(s'',s')\} \quad (7c)$$

where $\gamma(s_1,s_2)$ is the branch metric in the 16-state trellis between states $s_1$ and $s_2$. Sets B_abcde, B_bcdef, and B_abcdef have the cardinalities of 32, 32, and 64, respectively.

Figure 7B:
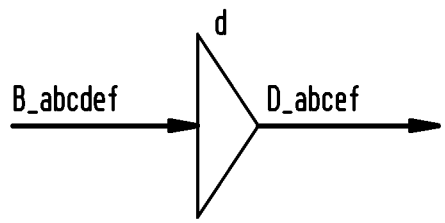

FIG. 7B shows a circuit symbol for a compare element 704. Compare element 704 is shown as being configured to identify a set of most-probable paths among all possible paths connecting states [cdef] and [abcd] in the 16-state trellis, with the identification being performed with respect to binary symbol d. More specifically, for each of the 32 possible values of the 5-bit word w5=abcef, compare element 704 identifies d(w5) as the value of d corresponding to the one of the double-transition branch metrics B_abc1ef and B_abc0ef having the larger Jacobi logarithm value. If max*B_abc1ef<max*B_abc0ef, then d(w5)=0. If max*B_abc1ef≥max*B_abc0ef, then d(w5)=1. The set consisting of the 32 identified values of d(w5) is denoted as D_abcef. In mathematical terms, set D_abcef is expressed by Eq. (8):

$$D\_abcef=\{d(w5):w5=abcef; a, b, c, e, f \in \{0,1\};$$

$$d(w5)=0, \text{ if } \max^*B\_abc1ef<\max^*B\_abc0ef;$$

$$d(w5)=1, \text{ if } \max^*B\_abc1ef \geq \max^*B\_abc0ef;$$

$$B\_abc1ef, B\_abc0ef \in B\_abcdef\} \qquad (8)$$

By definition, D_abcef consists of thirty-two one-bit values.

Figure 7C:
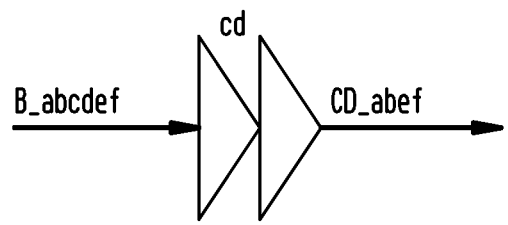

FIG. 7C shows a circuit symbol for a two-bit compare element 706. Two-bit compare element 706 is shown as being configured to identify a set of most-probable paths among all possible paths connecting states [cdef] and [abcd] in the 16-state trellis, with the identification being performed with respect to binary symbols c and d. More specifically, for each of the 16 possible values of the 4-bit word w4=abef, two-bit compare element 704 identifies cd(w4) as the value of the two-bit word cd corresponding to the one of the double-transition branch metrics B_ab11ef, B_ab10ef, B_ab01ef, and B_ab00ef having the largest Jacobi logarithm value. The set consisting of the 16 identified two-bit values of cd(w4) is denoted as CD_abef. In mathematical terms, set CD_abef is expressed by Eq. (9):

$$CD\_abef=\{cd(w4): w4=abef; a,b,c,e,f \in \{0,1\};$$

$$cd(w4)=00, \text{ if } \max^*B\_ab00ef>\max^*B\_ab10ef,$$
$$\max^*B\_ab01ef, \max^*B\_ab11ef;$$

$$cd(w4)=01, \text{ if } \max^*B\_ab01ef>\max^*B\_ab00ef,$$
$$\max^*B\_ab10ef, \max^*B\_ab11ef;$$

$$cd(w4)=10, \text{ if } \max^*B\_ab10ef>\max^*B\_ab00ef,$$
$$\max^*B\_ab01ef, \max^*B\_ab11ef;$$

$$cd(w4)=11, \text{ if } \max^*B\_ab11ef>\max^*B\_ab00ef,$$
$$\max^*B\_ab01ef, \max^*B\_ab10ef;$$

$$B\_ab11ef, B\_ab00ef, B\_ab01ef, B\_ab10ef \in B\_abcdef\} \qquad (9)$$

In the unlikely event of two or more of B_ab11ef, B_ab00ef, B_ab01ef, B_ab10ef having the same maximum value, the smallest value of cd(w4) can be selected for set CD_abef in one embodiment of the corresponding processing algorithm. One of ordinary skill in the art will appreciate that, in an alternative embodiment of the corresponding processing algorithm, some other suitable pre-determined ambiguity-resolution method can also be used. By definition, CD_abef consists of sixteen two-bit values.

Figure 7D:
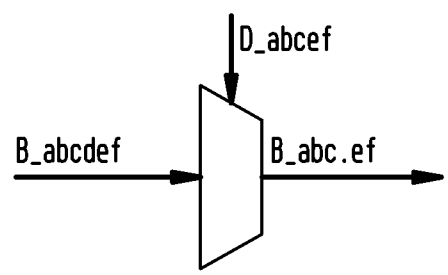

FIG. 7D shows a circuit symbol for a select element 708. Select element 708 is shown as being configured to filter set B_abcdef to select therein the thirty-two double-transition branch metrics, each corresponding to a respective one of values d(w5) from set D_abcef and to discard the other thirty-two double-transition branch metrics. The resulting filtered set of double-transition branch metrics is denoted B_abc.ef. In mathematical terms, set B_abc.ef is expressed by Eq. (10):

$$B\_abc.ef=\{\gamma(s'',s):s=[abcd]; s''=[cdef]; a, b, c, e, f \in \{0,1\};$$

$$d=d(w5); w5=abcef; d(w5) \in D\_abcef\} \qquad (10)$$

By definition, B_abc.ef contains the double-transition branch metrics corresponding to the set of most-probable paths connecting states [cdef] and [abcd] in the 16-state trellis, with said most-probable paths having been identified using compare element 704 as described above in reference to FIG. 7B.

Figure 7E:
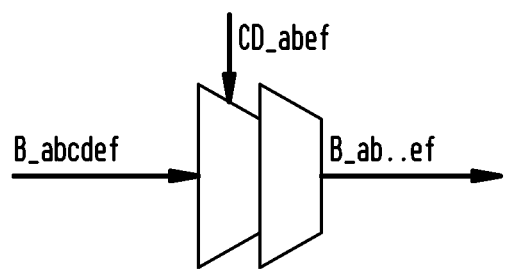

FIG. 7E shows a circuit symbol for a two-bit select element 710. Two-bit select element 710 is shown as being configured to filter set B_abcdef to select therein the sixteen double-transition branch metrics, each corresponding to a respective one of values cd(w4) from set CD_abef and to discard the other forty-eight double-transition branch metrics. The resulting filtered set of double-transition branch metrics is denoted B_ab...ef. In mathematical terms, set B_ab...ef is expressed by Eq. (11):

$$B\_ab\ldots ef=\{\gamma(s'',s): s=[abcd]; s''=[cdef]; a, b, e, f \in \{0,1\};$$

$$cd=cd(w4); w4=abef; cd(w4) \in CD\_abef\} \qquad (11)$$

By definition, B_ab...ef contains the double-transition branch metrics corresponding to the set of most-probable paths connecting states [cdef] and [abcd] in the 16-state trellis, with said most-probable paths having been identified using two-bit compare element 706 as described above in reference to FIG. 7C.

Figure 7F:
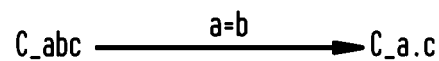

FIG. 7F shows a circuit symbol for an MTR-bit select element 712. MTR-bit select element 712 is shown as being configured to filter a set C_abc of combined metrics to select therein a subset C_a.c of combined metrics, wherein each combined metric satisfies the condition of a=b that expresses an inter-bit correlation introduced by the MTR code. In mathematical terms, subset C_a.c is expressed by Eq. (12):

$$C\_a.c=\{C\_aac: C\_aac \in C\_abc; a, c \in \{0,1\}\} \qquad (12)$$

where C_abc is a set of combined metrics C_abc, and a, b, c∈{0,1}. Combined metrics, such as combined metrics C_abc, are generated in accordance with the general methodology briefly described above in reference to FIG. 5 by combining the metrics corresponding to the forward and backward paths through the operative trellis. Description of the generation of sets of combined metrics analogous to set C_abc according to an embodiment of the disclosure is given below in reference to FIGS. 8 and 9. By definition, subset C_a.c includes the following four values: C_00c and C11c, where c∈{0,1}.

Figure 7G:
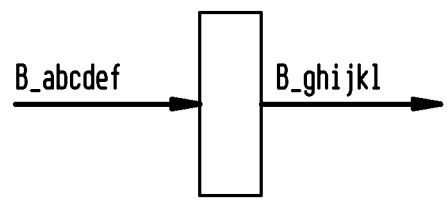

FIG. 7G shows a circuit symbol for a hold element 714. Hold element 714 is shown as being configured to hold or delay the values of the double-transition branch metrics of set B_abcdef for six full-rate clock cycles. Due to the delay introduced by hold element 714, set B_abcdef is transformed into set B_ghijkl at the output of the hold element. The values of the double-transition branch metrics do not change while they are being held by hold element 714, and the advancement of the alphabetic fragment in the name of the set down the alphabet by six letters simply indicates the amount of time (measured in full-rate clock cycles) that the values of the double-transition branch metrics have been held.

In one embodiment, hold element 714 is a memory element comprising sixty-four multi-bit registers, each sufficiently large to be able to receive and store a respective one of the double-transition branch metrics from set B_abcdef. When the multi-bit registers are configured to hold the double-transition branch metrics for six full-rate clock cycles, the multi-bit registers transform set B_abcdef into set B_ghijkl. One of ordinary skill in the art will understand that when the multi-bit registers are configured to hold the double-transition branch metrics for twelve full-rate clock cycles, the multi-bit registers perform the function of two serially connected hold elements 714. When the multi-bit registers are configured to hold the double-transition branch metrics for eighteen full-rate clock cycles, the multi-bit registers perform the function of three serially connected hold elements 714, and so on.

Figure 8:
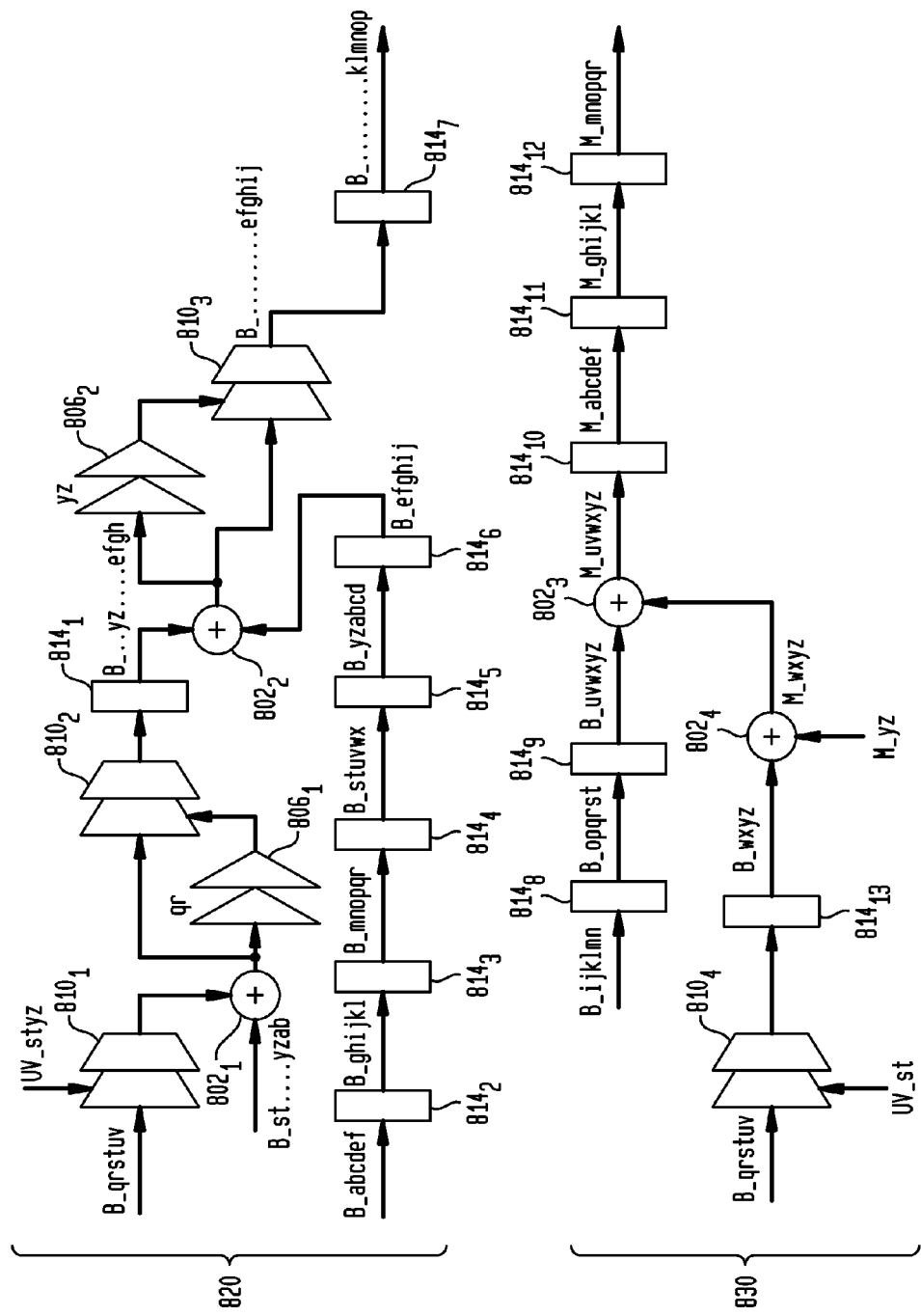
FIG. 8 shows a block diagram of a backward detector that can be used in the detector/codec module shown in FIG. 3 according to an embodiment of the disclosure.

FIG. 8 shows a block diagram of a backward detector 800 that can be used as backward detector 330 (FIG. 3) according to an embodiment of the disclosure. Backward detector 800 is designed for the fractional rate that is one sixths of the full rate, with the term "full rate" referring to the rate at which the corresponding front-end circuit (such as front-end circuit 210, FIG. 2) generates digital signal samples, one sample per bit, for the corresponding detector/codec module, such as module 220 (FIG. 2) or 300 (FIG. 3). As a result, the signal-processing pipeline of the detector/codec module that has backward detector 800 is configured to receive and process six digital signal samples (such as signal samples $y_i$ supplied to module 300 via signal 212; see FIG. 3 and the corresponding description) per fractional-rate clock cycle. In one embodiment, backward detector 800 can be used to process non-binary codewords corresponding to a constellation consisting of four ($=2^m$, where m=2) constellation symbols u, with the corresponding bit sequence having been encoded using an MTR(3) code. An exemplary sequence of signal samples processed by backward detector 800 is similar to that corresponding to bit sequence 600 (FIG. 6).

Backward detector 800 is configured to receive three sets of double-transition branch metrics (namely, B_qrstuv, B_abcdef, and B_ijklmn) from the upstream circuits, such as branch-metric processor 310 and forward detector 320 (see FIG. 3). As indicated above, double-transition branch metrics can be calculated, e.g., using add element 702, based on the corresponding single-transition branch metrics calculated by branch-metric processor 310. In various embodiments, the calculation of the double-transition branch metrics supplied to backward detector 800 can be performed either in branch-metric processor 310 or in forward detector 320 after the forward detector receives the corresponding single-transition branch metrics from the branch-metric processor. Also note that backward detector 800 is configured to use two copies of set B_qrstuv, one copy in a first processing path 820 thereof and the other copy in a second processing path 830 thereof.

Backward detector 800 is further configured to receive a set B_st . . . yzab of double-transition branch metrics for a set of paths through the 16-state trellis, each of which begins at a state [yzab] and has six subsequent transitions. The last two of these six transitions are caused by binary symbols t and s. The possible paths through the trellis corresponding to the first four of these six transitions have been processed to find a set of most-probable paths, which is indicated by the four dots in the name of set B_st . . . yzab. In one embodiment, set B_st . . . yzab can be calculated in forward detector 320, e.g., as described in the above-cited U.S. Patent Application Publication No. 2009/0185643, in the course of calculating the forward state metric(s) of the corresponding path P through the 16-state trellis (also see Eq. (4)). In an alternative embodiment, set B_st . . . yzab can be calculated using an appropriate combination of add, compare, and select elements from library 700, e.g., elements 702, 704, 706, 708, and 710 shown in FIGS. 7A-7E, respectively.

In operation, first processing path 820 is configured to calculate a set B_ . . . klmnop of double-transition branch metrics for a set of paths through the 16-state trellis, each of which begins at a state [mnop] and has ten subsequent transitions. The first two of these ten transitions are caused by binary symbols l and k. The possible paths through the trellis corresponding to the last eight of these ten transitions have been processed to find a set of most-probable paths, which is indicated by the eight dots in the name of set B_ . . . klmnop. This processing corresponds to the look-ahead period of eight, ten, and twelve time nodes for non-binary symbols kl, mn, and op, respectively.

First processing path 820 includes a two-bit select element 810$_1$ configured to filter set B_qrstuv to select therein the sixteen double-transition branch metrics corresponding to the most-probable paths through the trellis with respect to binary symbols u and v. Note that two-bit select element 810$_1$ operates similar to two-bit select element 710 (see FIG. 7E and the corresponding description). The filtered set of double-transition branch metrics generated by two-bit select element 810$_1$ is then combined, using an add element 802$_1$, with the above-described set B_st . . . yzab received from the upstream circuits, e.g., forward detector 320 (FIG. 3). Note that add element 802$_1$ operates similar to add element 702 (see FIG. 7A and the corresponding description). The set of branch metrics generated by add element 802$_1$ is set B_qrst . . . yzab (not explicitly shown in FIG. 8). As the notation implies, set B_qrst . . . yzab has the branch metrics corresponding to the set of most-probable paths through the trellis, each starting at a state [yzab] and ending at a state [qrst].

First processing path 820 further includes a two-bit select element 810$_2$, a two-bit compare element 806$_1$, and a hold element 814$_1$ connected to one another as indicated in FIG. 8. Two-bit select element 810$_2$ and two-bit compare element 806$_1$ operate similar to two-bit select element 710 (FIG. 7E) and two-bit compare element 706 (FIG. 7C), respectively, and are configured to filter set B_qrst . . . yzab generated by add element 802$_1$ to remove the dependency from binary symbols q and r. The resulting filtered set is set B_ . . . st . . . yzab (not explicitly shown in FIG. 8). Hold element 814$_1$ (which is similar to hold element 714, FIG. 7G) operates to delay set B_ . . . st . . . yzab by one fractional-rate clock cycle, thereby transforming it into set B_ . . . yz . . . efgh.

First processing path 820 also has five serially connected hold elements 814$_2$-814$_6$ configured to delay set B_abcdef by five fractional-rate clock cycles, thereby transforming it into set B_efghij. Note that the two ef's in the respective names of sets B_abcdef and B_efghij do not refer to the same symbols because the delay imposed by hold elements 814$_2$-814$_6$ causes these two pairs of binary symbols to be separated from each other by one full alphabetic set or twenty-six full-rate clock cycles. Set B_efghij provided by hold element 814$_6$ is combined, using an add element 802$_2$, with set B_..yz....efgh provided by hold element 814$_1$ to generate set B_ . . . yz . . . efghij (not explicitly shown in FIG. 8). Note that add element 802$_2$ operates similar to add element 802$_1$.

A two-bit select element 810$_3$ and a two-bit compare element 806$_2$ operate similar to two-bit select element 810$_2$ and two-bit compare element 806$_1$, respectively, and are configured to filter set B_ . . . yz . . . efghij generated by add element 802$_2$ to remove the dependency from binary symbols y and z. The resulting filtered set is set B_ . . . efghij. A hold element 814$_7$ (which is similar to other hold elements 814 in backward detector 800) operates to delay set B_ . . . efghij by one fractional-rate clock cycle, thereby transforming it into set B_ . . . klmnop.

Second processing path 830 in backward detector 800 is configured to calculate a set M_mnopqr of path metrics corresponding to a set of paths through the 16-state trellis, each passing through a state [opqr] and having two subsequent transitions from that state caused by binary symbols n and m. A two-bit select element 810$_4$ (which is similar to other two-bit select elements 810 in backward detector 800) is configured to filter set B_qrstuv of double-transition branch metrics to remove the dependency from binary symbols u and v. The resulting filtered set of double-transition branch metrics is set B_qrst (not explicitly shown in FIG. 8). A hold element $814_{13}$ (which is similar to other hold elements 814 in backward detector 800) operates to delay set B_qrst by one fractional-rate clock cycle, thereby transforming it into set B_wxyz. Set B_wxyz provided by hold element $814_{13}$ is then combined, using an add element $802_4$, with a set M_yz of forward state metrics. In one embodiment, set M_yz can be recursively calculated based on Eq. (2) in forward detector 320, e.g., as described in the above-cited U.S. Patent Application Publication No. 2009/0185643. Note that add element $802_4$ operates similar to other add elements 802 in backward detector 800. The result generated by add element $802_4$ is a set M_wxyz of path metrics, each corresponding to a path through the trellis that ends at a state [wxyz].

An add element $802_3$ (which operates similar to add element $802_4$) is configured to combine set M_wxyz generated by add element $802_4$ with a set B_uvwxyz of double-transition branch metrics received through serially connected hold elements $814_8$ and $814_9$ from the upstream circuits, such as branch-metric processor 310 and forward detector 320 (see FIG. 3). More specifically, hold elements $814_8$ and $814_9$ operate to delay the above mentioned input set B_ijklmn by two fractional-rate clock cycles, thereby transforming it into set B_uvwxyz. The result produced by add element $802_3$ is a set M_uvwxyz of path metrics, each corresponding to a path through the trellis that passes through a state [wxyz] and ends at a state [uvwx]. Set M_uvwxyz is then delayed by three fractional-rate clock cycles in serially connected hold elements $814_{10}$-$814_{12}$, which transform it into the above-mentioned output set M_mnopqr.

Figure 9:
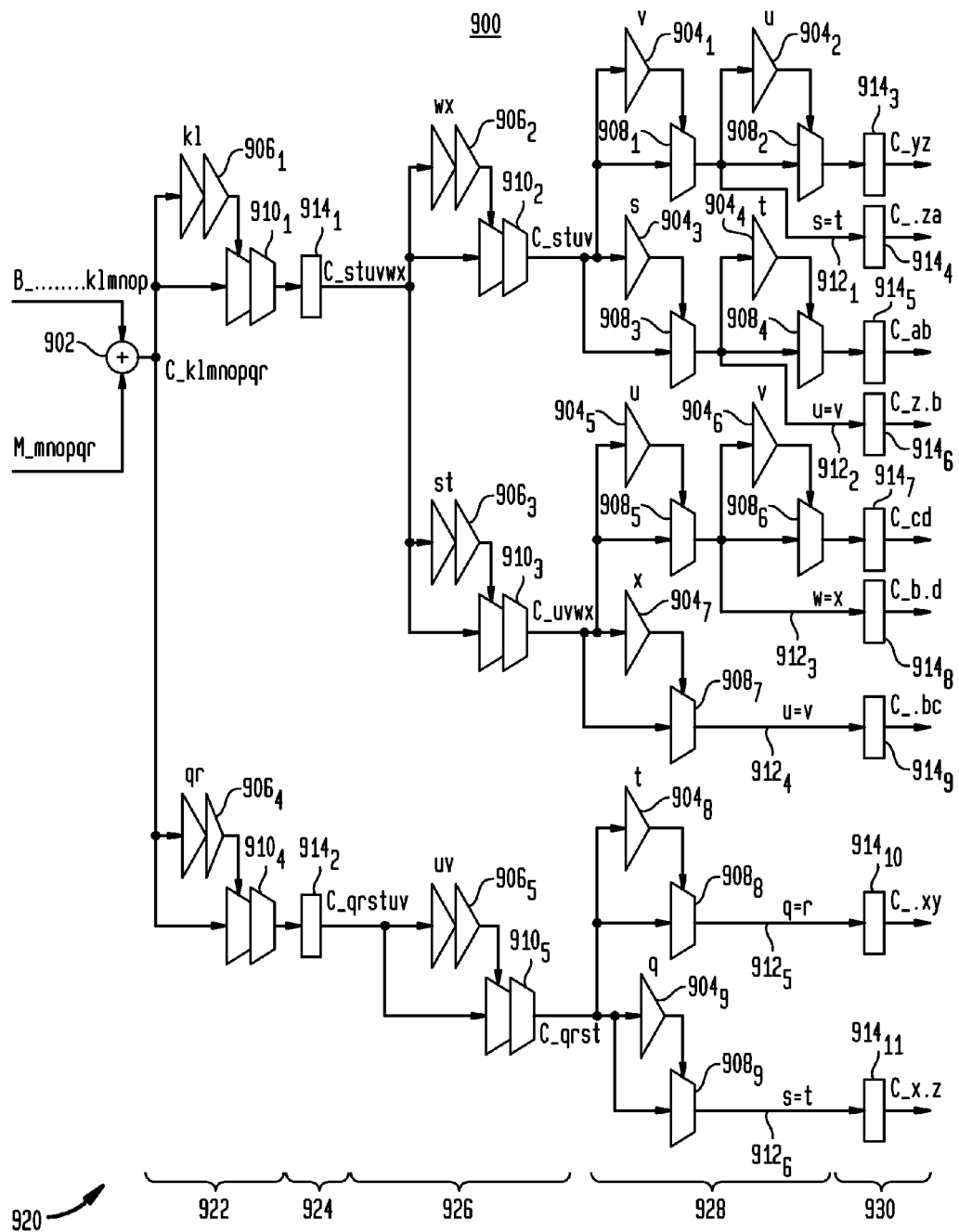
FIG. 9 shows a block diagram of a combined-detector/soft-MTR(3)-decoder module that can be used in the detector/codec module shown in FIG. 3 according to an embodiment of the disclosure.

FIG. 9 shows a block diagram of a combined-detector/soft-MTR(3)-decoder module 900 that can be used as module 340 (FIG. 3) according to an embodiment of the disclosure. Module 900 is designed to be compatible with backward detector 800 and, as such, operates at a fractional rate of one sixth of the full rate to process non-binary codewords corresponding to a constellation consisting of four ($=2^m$, where m=2) constellation symbols u, with the corresponding bit sequence having been encoded using an MTR(3) code. Similar to backward detector 800, module 900 can be implemented using various pertinent elements from library 700 (see FIGS. 7A-7G) according to an embodiment of the disclosure.

In operation, module 900 is configured to (i) combine sets B_. . . klmnop and M_mnopqr received from processing paths 820 and 830, respectively, of backward detector 800 to generate a corresponding set of combined metrics in accordance with the general methodology briefly described above in reference to FIG. 5 and (ii) filter said set of combined metrics to identify the combined metrics corresponding to the most-probable paths through the time node of the 16-state trellis with respect to which the forward and backward path metrics have been calculated in the corresponding upstream circuits. One of ordinary skill in the art will understand that said time node is analogous to the k-th node shown in FIG. 5. In the "pipelined" notation, said time node is the time node having the 16 states denoted [mnop]. The filtering of the combined metrics performed in module 900 takes into account the inter-symbol correlations imposed by the MTR(3) code, which enables module 900 to substantially operate as a soft-output MTR(3) decoder. The filtered combined metrics are supplied to an LLR calculator, such as LLR calculator 346 (FIG. 3), for the calculation of the corresponding LLR values, such as LLR values 348 (FIG. 3), e.g., in accordance with Eqs. (4) and (5).

Module 900 has an add element 902 configured to combine sets B_. . . klmnop and M_mnopqr received from backward detector 800 to generate a set C_klmnopqr of combined metrics. Note that add element 902 operates similar to add element 702 (see FIG. 7A and the corresponding description). Set C_klmnopqr has the combined metrics corresponding to the most-probable paths through the 16-state trellis, each passing through a state [mnop] and also including (i) two transitions caused by binary symbols q and r and leading to that state and (ii) two transitions caused by binary symbols l and k and stemming from that state. The backward paths corresponding to set C_klmnopqr are the same as those corresponding to set B_. . . klmnop. The forward paths corresponding to set C_klmnopqr are the same as those corresponding to set M_mnopqr. Set C_klmnopqr has a cardinality of two hundred and fifty six ($=2^8$).

Module 900 further has a filter 920 that comprises a plurality of variously configured compare and select elements from library 700 (see FIGS. 7A-7G) interconnected as indicated in FIG. 9. More specifically, filter 920 comprises: (i) compare elements $904_1$-$904_9$, each analogous to compare element 704 (FIG. 7B); (ii) two-bit compare elements $906_1$-$906_5$, each analogous to two-bit compare element 706 (FIG. 7C); (iii) select elements $908_1$-$908_9$, each analogous to select element 708 (FIG. 7D); (iv) two-bit select elements $910_1$-$910_5$, each analogous to two-bit select element 710 (FIG. 7E); and (v) MTR-bit select elements $912_1$-$912_6$, each analogous to MTR-bit select element 712 (FIG. 7F). These compare and select elements are arranged in filter 920 to form three filter stages, which are labeled 922, 926, and 928, respectively.

In addition to filter stages 922, 926, and 928, filter 920 comprises hold stages 924 and 930. Hold stage 924 is coupled between filter stages 922 and 926 and includes hold elements $914_2$ and $914_2$. Hold stage 930 is coupled to the output of filter stage 928 and includes hold elements $914_3$-$914_{11}$. Each of hold elements $914_1$-$914_{11}$ in filter 920 is analogous to hold element 714 (FIG. 7).

Figure 10:
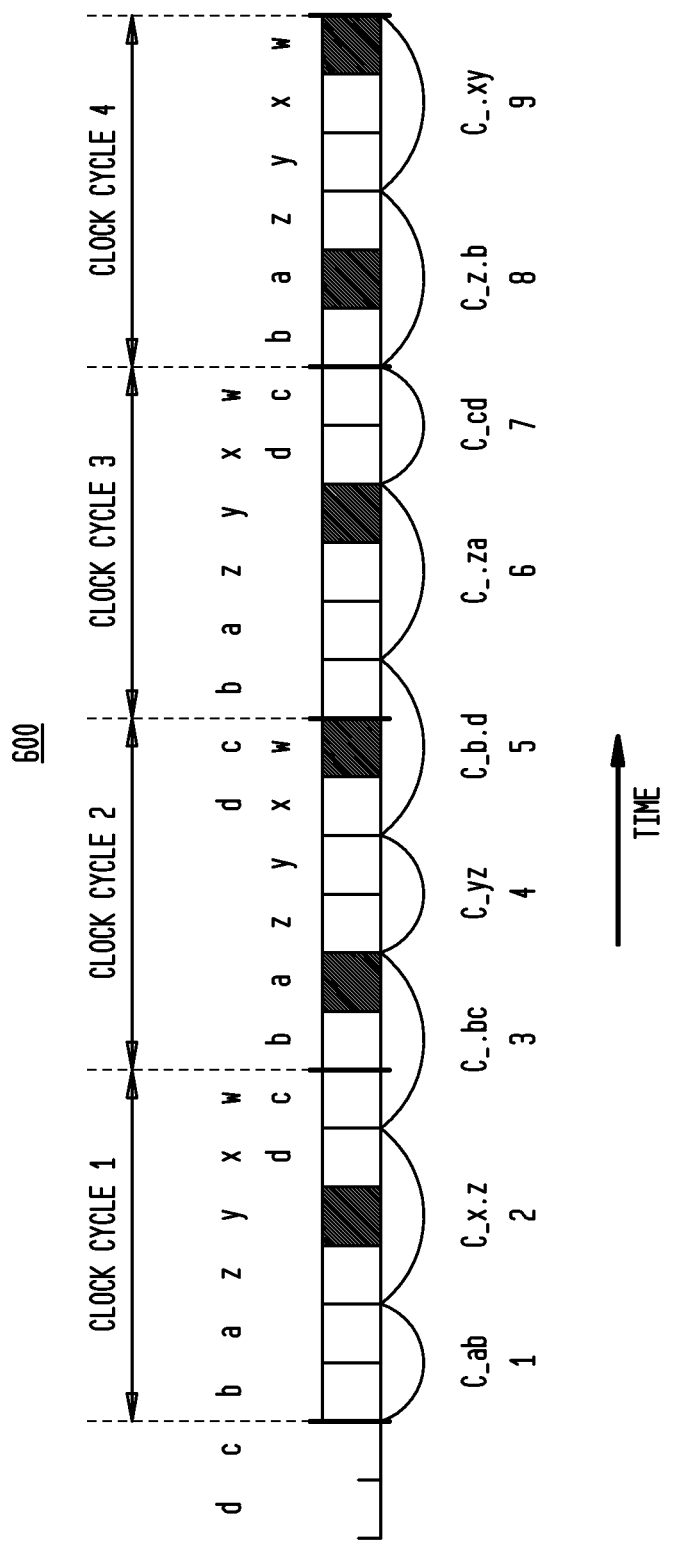
FIG. 10 illustrates the processing performed in the combined-detector/soft-MTR(3)-decoder shown in FIG. 9, using the MTR-encoded bit sequence corresponding to FIG. 6 as an example, according to an embodiment of the disclosure.

To aid the understanding of the processing performed in filter 920, the subsequent description of this processing is given in reference to FIGS. 9, 10, and 11.

FIG. 10 shows MTR-encoded bit sequence 600 previously shown in FIG. 6, but with additional labels/markup that help to interrelate this bit sequence and the processing performed in filter 920. Recall that sequence 600 has nine MTR(3)-encoded two-bit symbols labeled 1 through 9. Each of two-bit symbols 1-9 has two respective symbol bits shown in FIG. 6 as unfilled squares. The MTR(3) encoding has added one MTR bit per three symbol bits, which has inserted additional bits into some, but not all, of two-bit symbols 1-9 as indicated by the filled squares in FIG. 10, with each filled square representing a respective MTR bit. Also shown in FIG. 10 are the two full-rate clock cycles that precede sequence 600.

Sequence 600 spans twenty-four full-rate clock cycles or four fractional-rate clock cycles. The fractional-rate clock cycles are numbered 1 through 4 and demarcated in FIG. 10 by the four double-headed arrows. The flow of time is indicated by the solid arrow shown in the lower portion of FIG. 10. One of ordinary skill in the art will understand that, the later in time a symbol bit is received, the closer that symbol bit is located to the right side of sequence 600.

As already mentioned above, module 900 is designed to operate at the above-indicated fractional rate, which means that it is capable of processing the combined metrics corresponding to sequence 600 in four fractional-rate clock cycles. Also note that each of the four fractional-rate clock cycles shown in FIG. 10 has a different respective composition in terms of the order of the various symbol bits and MTR bits.

Furthermore, some of the two-bit symbols, such as two-bit symbols 3 and 5, span the boundary between two adjacent fractional-rate clock cycles. However, fractional-rate clock cycles having the same composition (in terms of the order of the various symbol bits and MTR bits) reappear with a periodicity of four fractional-rate clock cycles. Thus, a description of the processing steps corresponding to sequence 600 is sufficient for understanding the operation of module 900 in general and of filter 920 in particular because module 900 is configured to repeat these processing steps every four fractional-rate clock cycles.

FIG. 11 shows a table (denoted Table 1) that defines the relationship between the binary symbols at different stages of filter 920 according to an embodiment of the disclosure. More specifically, the upper row in Table 1 lists the various binary symbols with respect to which the combined metrics of set C_klmnopqr are calculated in the upstream circuitry. The presence of hold stages 924 and 930 in filter 920 causes nomenclatorial shifts in the designation of these binary symbols as indicated in the middle and lower rows, respectively, of Table 1. Filter 920 is designed to operate in accordance with the mapping of the binary symbols from the lower row of Table 1 onto sequence 600 that is shown in FIG. 10. Note that each of the four fractional-rate clock cycles corresponding to sequence 600 includes only six (namely, wxyzab) of the eight binary symbols shown in the lower row of Table 1, while the preceding fractional-rate clock cycle contains the remaining two binary symbols (namely, cd) from the lower row of Table 1. This split of the eight binary symbols corresponding to set C_klmnopqr between two adjacent fractional-rate clock cycles has implications to the manner in which the various filtered combined metrics are read-out from hold stage 930, which is further detailed below.

Referring back to FIG. 9, a first (upper) branch of filter stage 922 (having two-bit compare element $906_1$ and two-bit select element $910_1$) in filter 920 operates to filter set C_klmnopqr to remove the dependency from binary symbols k and l. The resulting filtered set of combined metrics is set C_mnopqr (not explicitly shown in FIG. 9). In effect, the processing performed in the upper branch of filter stage 922 identifies a set of most probable backward paths, each stemming from a state [mnop] and also being connected to the corresponding forward paths that include the transitions caused by binary symbols q and r.

A hold element $914_1$ operates to delay set C_mnopqr received from two-bit select element $910_1$ by one fractional-rate clock cycle, thereby transforming this set into set C_stuvwx. Hold element $914_1$ further operates to transfer set C_stuvwx to filter stage 924 for further processing therein.

Note that the filtering performed in the upper branch of filter stage 922 is compatible with the MTR(3) filtering performed at filter stage 928 for some but not all of MTR(3)-encoded symbols 1-9. For example, the filtering performed in the upper branch of filter stage 922 is incompatible with the MTR(3) filtering of the combined metrics corresponding to MTR(3)-encoded symbols 2 and 9 because removal of the dependency from binary symbols k and l in the upper branch of filter stage 922, in effect, removes the dependency from binary symbols w and x at the output of filter 920 (see Table 1, FIG. 11). However, MTR(3) filtering of MTR(3)-encoded symbol 2 requires the presence of yet-unfiltered combined metrics corresponding to binary symbol x (see FIG. 10). Similarly, MTR(3) filtering of MTR(3)-encoded symbol 9 requires the presence of yet-unfiltered combined metrics corresponding to both binary symbols w and x (see FIG. 10). By further inspecting FIG. 10, one of ordinary skill in the art will understand that the filtering performed in the upper branch of filter stage 922 is compatible with the MTR(3) filtering of the combined metrics corresponding to all other MTR(3)-encoded symbols (i.e., symbols 1 and 3-8) of sequence 600.

Due to the incompatibility explained in the preceding paragraph, filter stage 922 has a second (lower) branch (having two-bit compare element $906_4$ and two-bit select element $910_4$) in addition to the above-described first or upper branch. By inspecting FIG. 10, one of ordinary skill in the art will understand that the filtering performed in the lower branch of filter stage 922 is compatible with the MTR(3) filtering of the combined metrics corresponding to MTR(3)-encoded symbols 2 and 9 of sequence 600.

The lower branch of filter stage 922 in filter 920 operates to filter set C_klmnopqr to remove the dependency from binary symbols q and r. The resulting filtered set of combined metrics is set C_klmnop (not explicitly shown in FIG. 9). In effect, the processing performed in the lower branch of filter stage 922 identifies a set of most probable forward paths, each leading to a state [mnop] and also being connected to the corresponding backward paths that include the transitions caused by binary symbols k and l.

A hold element $914_2$ operates to delay set C_klmnop received from two-bit select element $910_4$ by one fractional-rate clock cycle, thereby transforming this set into set C_qrstuv. Hold element $914_2$ further operates to transfer set C_qrstuv to filter stage 924 for further processing therein.

Filter stage 926 in filter 920 comprises three parallel branches. A first (upper) branch of filter stage 926 is coupled to hold element $914_2$ and comprises two-bit compare element $906_2$ and two-bit select element $910_2$. A second (middle) branch of filter stage 926 is similarly coupled to hold element $914_2$ and comprises two-bit compare element $906_3$ and two-bit select element $910_3$. A third (lower) branch of filter stage 926 is coupled to hold element $914_2$ and comprises two-bit compare element $906_5$ and two-bit select element $910_5$.

The upper branch of filter stage 926 operates to filter set C_stuvwx to remove the dependency from binary symbols w and x. The resulting filtered set of combined metrics is set C_stuv. In effect, the processing performed in the upper branch of filter stage 926 identifies a set of most probable forward paths, each stemming from a state [stuv] (=[mnop] in the nomenclature of filter stage 922, see Table 1, FIG. 11).

The middle branch of filter stage 926 operates to filter set C_stuvwx to remove the dependency from binary symbols s and t. The resulting filtered set of combined metrics is set C_uvwx. In effect, the processing performed in the middle branch of filter stage 926 identifies a subset of states [stuv], wherein each of said states corresponds to the largest Jacobi logarithm value in the subset of four combined metrics C_stuvwx with a respective fixed value of uvwx.

The lower branch of filter stage 926 operates to filter set C_qrstuv to remove the dependency from binary symbols u and v. The resulting filtered set of combined metrics is set C_qrst. In effect, the processing performed in the middle branch of filter stage 926 identifies a subset of states [stuv], wherein each of said states corresponds to the largest Jacobi logarithm value in the subset of four combined metrics C_qrstuv with a respective fixed value of qrst.

Filter stage 928 operates to further filter the three sets of combined metrics generated by the three branches of filter stage 926 to select the combined metrics corresponding to the sets of paths and/or states in the 16-state trellis characterized by the respective largest Jacobi logarithm values. One part of this filtering is performed using select elements $908_1$-$908_9$, each configured using a respective one of compare elements $904_1$-$904_9$. Another part of this filtering is performed using MTR-bit select elements $912_1$-$912_6$.

More specifically, filter stage 928 operates to filter set C_stuv received from the upper branch of filter stage 926 to select the following four subsets of combined metrics (not explicitly shown in FIG. 9): C_st, C_.tu, C_uv, and C_t.v. Hold stage 930 then delays these subsets of combined metrics by one fractional-rate clock cycle, thereby transforming them into subsets C_yz, C_.za, Cab, and C_z.b, respectively (also see Table 1, FIG. 11).

Filter stage 928 further operates to filter set C_uvwx received from the middle branch of filter stage 926 to select the following three subsets of combined metrics (not explicitly shown in FIG. 9): C_wx, C_v.x, and C_.vw. Hold stage 930 then delays these subsets of combined metrics by one fractional-rate clock cycle, thereby transforming them into subsets C_cd, C_b.d, and C_.bc, respectively (also see Table 1, FIG. 11).

Filter stage 928 further operates to filter set C_qrst received from the lower branch of filter stage 926 to select the following two subsets of combined metrics (not explicitly shown in FIG. 9): C_.rs and C_r.t. Hold stage 930 then delays these subsets of combined metrics by one fractional-rate clock cycle, thereby transforming them into subsets C_.xy and C_x.z, respectively (also see Table 1, FIG. 11).

In one embodiment, to calculate LLR values corresponding to sequence 600, an LLR calculator, such as LLR calculator 346 (FIG. 3), is configured to read out and processes the various subsets from hold stage 930 of filter 920, for example, as follows.

Referring to FIGS. 9 and 10, in fractional-rate clock cycle 1, the LLR calculator reads out and processes subsets C_ab and C_x.z from hold elements $914_5$ and $914_{11}$, respectively. In fractional-rate clock cycle 2, the LLR calculator reads out and processes subsets C_.bc and C_yz from hold elements $914_9$ and $914_3$, respectively. In fractional-rate clock cycle 3, the LLR calculator reads out and processes subsets C_b.d and C_.za from hold elements $914_8$ and $914_4$, respectively. Finally, in fractional-rate clock cycle 4, the LLR calculator reads out and processes subsets C_cd, C_z.b, and C_.xy from hold elements $914_7$, $914_6$, and $914_{10}$, respectively. As already indicated above, this readout cycle is repeated every four fractional-rate clock cycles.

One of ordinary skill in the art will understand that each of subsets C_ab, C_x.z, C_.bc, C_yz, C_b.d, C_.za, C_cd, C_z.b, and C_.xy can be converted, e.g., in accordance with Eqs. (4) and (5), into a set $L_j(u)$ (where j=0, 1, 2, 3) of LLR values for the corresponding two-bit constellation symbol u, namely two-bit constellation symbols 1-9 of sequence 600 (see FIG. 10). The LLR values of set $L_j(u)$ can further be converted into LLR values of the individual bits of the corresponding two-bit constellation symbol u, e.g., in accordance with Eq. (6). Depending on the type of processing implemented in the corresponding LDPC decoder (such as LDPC decoder 260, FIG. 2), the LLR calculator (such as LLR calculator 346, FIG. 3) coupled to module 900 can be configured to perform an appropriate type of processing and conversion of the above-enumerated subsets of combined metrics readout from hold stage 930 of filter 920 to generate the corresponding LLR values. The generated LLR values are then passed further downstream and processed in the downstream circuits, e.g., as described above in reference to FIGS. 2 and 3.

According to an embodiment disclosed above in reference to FIGS. 1-11, provided is a receiver (e.g., 200, FIG. 2) configured for use in a communication system, such as a magnetic recording channel, the receiver comprising a soft-output channel detector (e.g., 220, FIG. 2) configured to process an input signal (e.g., 212, FIG. 2) carrying a bit sequence (e.g., 600, FIGS. 6 and 10) to generate one or more sets of metrics (e.g., C_klmnopqr, FIG. 9) corresponding to one or more paths through a trellis. A path through the trellis comprises a plurality of serially connected branches, each corresponding to a respective bit of the bit sequence. The bit sequence comprises a plurality of modulation bits, each generated by an application of a modulation code to a respective set of parity bits generated using a block error-correction code. The receiver further comprises a filter circuit (e.g., 920, FIG. 9) configured to generate one or more output subsets (e.g., C_x.z, C_yz, FIG. 9) of the one or more sets of metrics, wherein at least one of the one or more output subsets is generated based on an inter-bit correlation imposed by the modulation code.

In some embodiments of the above receiver, the bit sequence comprises a sequence of non-binary symbols (e.g., 1-9, FIGS. 6 and 10); and the filter circuit is configured to generate the one or more output subsets such that a generated output subset corresponds to respective one of the non-binary symbols.

In some embodiments of any of the above receivers, a non-binary symbol in the sequence of non-binary symbols is represented by m bits, where m is a positive integer greater than one; and the bit sequence has one modulation bit per r parity bits, where r is a positive integer greater than one and r≠m.

In some embodiments of any of the above receivers, the receiver further comprises: a log-likelihood-ratio calculator (e.g., 346, FIG. 3) configured to convert the one or more output subsets generated by the filter circuit into log-likelihood ratios that represent the sequence of non-binary symbols based on the input signal; and a parity-check decoder (e.g., 260, FIG. 2) configured to apply parity-check-based-decoding to the log-likelihood ratios generated by the log-likelihood-ratio calculator to enable the apparatus to recover information bits encoded in the input signal, wherein the parity-check-based-decoding is based on a non-binary low-density parity-check code.

In some embodiments of any of the above receivers, the modulation code is a maximum-transition-run code; and the block error-correction code is a low-density parity-check code.

In some embodiments of any of the above receivers, the receiver further comprises a log-likelihood-ratio calculator (e.g., 346, FIG. 3) configured to convert the one or more output subsets generated by the filter circuit into log-likelihood ratios that represent the bit sequence based on the input signal.

In some embodiments of any of the above receivers, the receiver further comprises a parity-check decoder (e.g., 260, FIG. 2) configured to apply parity-check-based decoding to the log-likelihood ratios generated by the log-likelihood-ratio calculator to enable the apparatus to recover information bits encoded in the input signal.

In some embodiments of any of the above receivers, the receiver further comprises a feedback path from the parity-check decoder to the soft-output channel detector. The parity-check decoder is configured to apply said parity-check-based decoding to a first log-likelihood-ratio word (e.g., 252, FIG. 2) having a set of the log-likelihood ratios generated by the log-likelihood-ratio calculator to generate a second log-likelihood-ratio word (e.g., 262, FIG. 2). When the second log-likelihood-ratio word does not satisfy one or more parity checks of the parity-check-based decoding, the soft-output channel detector is configured to regenerate the one or more sets of metrics based on the second log-likelihood-ratio word.

In some embodiments of any of the above receivers, the feedback path comprises a soft-input/soft-output modulation encoder (e.g., 360, FIG. 3) configured to apply the modulation code to a subset (e.g., 226, FIG. 2) of log-likelihood-ratio values of the second log-likelihood-ratio word to generate a corresponding modulation-encoded set (e.g., 346, FIG. 3) of log-likelihood-ratio values, wherein said modulation-encoded set of the log-likelihood-ratio values represents modulation-encoded parity bits of a corresponding codeword carried by the input signal.

In some embodiments of any of the above receivers, the parity-check decoder is configured to: apply said parity-check-based decoding to a first log-likelihood-ratio word to generate a second log-likelihood-ratio word (e.g., 262, FIG. 2); and direct the second log-likelihood-ratio word to the soft-output channel detector to enable decoding iterations between the soft-output channel detector and the parity-check decoder.

In some embodiments of any of the above receivers, the receiver further comprises: a hard-decision filter (e.g., 280, FIG. 2) configured to remove magnitude bits from a first set (e.g., 228, FIG. 2) of log-likelihood-ratio values of the second log-likelihood-ratio word to generate a corresponding modulation-encoded word (e.g., 282, FIG. 2), wherein said first set of the log-likelihood-ratio values represents modulation-encoded information bits carried by the input signal; and a modulation decoder (e.g., 290, FIG. 2) configured to apply an additional modulation code to the modulation-encoded information bits to recover the information bits encoded in the input signal.

In some embodiments of any of the above receivers, the additional modulation code is a run-length-limited code or a maximum-transition-run code.

In some embodiments of any of the above receivers, the additional modulation code is a first maximum-transition-run code; and the modulation code is a second maximum-transition-run code that is different from the first maximum-transition-run code.

In some embodiments of any of the above receivers, the receiver further comprises a front-end circuit (e.g., 210, FIG. 2) configured to generate the input signal based on a signal received from a magnetic recording channel.

In some embodiments of any of the above receivers, the soft-output channel detector comprises: a branch-metric processor (e.g., 310, FIG. 3) configured to generate branch metrics based on the input signal and the trellis; a forward detector (e.g., 320, FIG. 3) configured to recursively calculate forward state metrics for the one or more paths through the trellis based on the branch metrics, wherein a corresponding recursion is performed in a forward direction; a backward detector (e.g., 330, FIG. 3) configured to recursively calculate backward state metrics for the one or more paths through the trellis, wherein a corresponding recursion is performed in a backward direction; and a combined detector (e.g., 340, FIG. 3) configured to calculate the one or more sets of metrics based on the branch metrics, the forward state metrics, and the backward state metrics.

In some embodiments of any of the above receivers, the soft-output channel detector is configured for continuous pipelined data flow therethrough using a sliding-window log-(Maximum A Posteriori) algorithm; and the soft-output channel detector comprises one or more pipeline registers (e.g., 814, FIG. 8) for storing at least some of the calculated metrics to enable said continuous pipelined data flow.

In some embodiments of any of the above receivers, each time node of the trellis has sixteen states, each corresponding to a respective four-bit value; each of the one or more sets of metrics calculated by the combined detector has a cardinality of 256; and each of the one or more output subsets generated by the filter circuit has a cardinality of four.

In some embodiments of any of the above receivers, the filter circuit comprises a first filter stage having a first branch and a second branch, wherein: the first branch comprises a first two-bit select element (e.g., $910_1$, FIG. 9) controlled by a first two-bit compare element (e.g., $906_1$, FIG. 9) and configured to generate a first subset (e.g., C_mnopqr, FIG. 9) of a set of metrics (e.g., C_klmnopqr, FIG. 9) calculated by the combined detector; the second branch comprises a second two-bit select element (e.g., $910_4$, FIG. 9) controlled by a second two-bit compare element (e.g., $906_4$, FIG. 9) and configured to generate a second subset (e.g., C_klmnop, FIG. 9) of said set of metrics calculated by the combined detector; said set of metrics calculated by the combined detector has a first cardinality; each of the first and second subsets has a second cardinality that is smaller than the first cardinality by a factor of four; and the filter circuit is configured to generate the one or more output subsets based on the first and second subsets.

In some embodiments of any of the above receivers, the filter circuit further comprises a second filter stage coupled to the first filter stage and having a first branch, a second branch, and a third branch, wherein: the first branch of the second filter stage comprises a third two-bit select element (e.g., $910_2$, FIG. 9) controlled by a third two-bit compare element (e.g., $906_2$, FIG. 9) and configured to generate a third subset (e.g., C_stuv, FIG. 9) of said set of metrics calculated by the combined detector by further narrowing the first subset; the second branch of the second filter stage comprises a fourth two-bit select element (e.g., $910_3$, FIG. 9) controlled by a fourth two-bit compare element (e.g., $906_6$, FIG. 9) and configured to generate a fourth subset (e.g., C_uvwx, FIG. 9) of said set of metrics calculated by the combined detector by further narrowing the first subset; and the third branch of the second filter stage comprises a fifth two-bit select element (e.g., $910_5$, FIG. 9) controlled by a fifth two-bit compare element (e.g., $906_5$, FIG. 9) and configured to generate a fifth subset (e.g., C_qrst, FIG. 9) of said set of metrics calculated by the combined detector by further narrowing the second subset; each of the third, fourth, and fifth subsets has a third cardinality that is smaller than the second cardinality by a factor of four; and the filter circuit is configured to generate the one or more output subsets based on the third, fourth, and fifth subsets.

In some embodiments of any of the above receivers, the filter circuit further comprises a third filter stage (e.g., 928, FIG. 9) coupled to the second filter stage and having a plurality of branches, wherein each branch of the third filter stage is configured to generate a respective one of the output subsets by further narrowing a respective one of the third, fourth, and fifth subsets.

In some embodiments of any of the above receivers, the filter circuit comprises a plurality of hold elements (e.g., 914, FIG. 9), each configured to temporarily store a respective one of the output subsets generated by the filter circuit, wherein: the filter circuit is configured to operate at a fractional rate; and at least two of the hold elements are read out in different respective fractional-rate clock cycles.

While this invention has been described with reference to embodiments, this description is not intended to be construed in a limiting sense.

Various modifications of the described embodiments, as well as other embodiments, which are apparent to persons skilled in the art to which the invention pertains are deemed to lie within the scope of the invention as expressed in the following claims.

Unless explicitly stated otherwise, each numerical value and range should be interpreted as being approximate as if the word "about" or "approximately" preceded the value of the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The use of figure numbers and/or figure reference labels in the claims is intended to identify one or more possible embodiments of the claimed subject matter in order to facilitate the interpretation of the claims during the examination. Such use is not to be construed as necessarily limiting the scope of those claims to the embodiments indicated by the used figure numbers and/or figure reference labels.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Embodiments of the invention can be manifest in other specific apparatus and/or methods. The described embodiments are to be considered in all respects as only illustrative and not restrictive. All changes that come within the meaning and range of equivalency of the claims are to be embraced within their scope.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of the methods described herein. The program storage devices may be, e.g., digital memories, magnetic storage media, such as magnetic disks or tapes, hard drives, or optically readable digital data storage media. The embodiments are also intended to cover computers programmed to perform said steps of methods described herein.

The description and drawings merely illustrate embodiments of the invention. Furthermore, all examples recited herein are principally intended expressly to be only for pedagogical purposes to aid the reader in understanding an embodiment of the invention and the concepts contributed by the inventor(s) to furthering the art, and are to be construed as being without limitation to such specifically recited examples and conditions. Moreover, all statements herein reciting embodiments of the invention, as well as specific examples thereof, are intended to encompass equivalents thereof.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "computer," "processor," or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those of ordinary skill in the art that any block diagrams herein represent conceptual views of circuitry representing one of more embodiments of the invention. Similarly, it will be appreciated that any flowcharts, flow diagrams, state transition diagrams, pseudo code, and the like represent various processes which may be substantially represented in computer readable medium and so executed by a computer or processor, whether or not such computer or processor is explicitly shown.

Although embodiments of the invention have been described herein with reference to the accompanying drawings, it is to be understood that embodiments of the invention are not limited to the described embodiments, and one of ordinary skill in the art will be able to contemplate various other embodiments of the invention within the scope of the following claims.

Although some portions of the detailed description have been presented in terms of algorithms and symbolic representations of operations on data bits, these algorithmic descriptions and representations are the means used by those of ordinary skill in the art of data processing to most effectively convey the substance of their work to others. It has proven convenient at times, principally for reasons of common usage, to refer to some signals as bits, words, values, elements, symbols, characters, numbers, or the like. It should be born in mind, however, that all of these and similar terms are associated with tangible physical quantities and are merely convenient labels intended to refer to those physical quantities. Unless specifically stated otherwise, as apparent from the detailed description, it should be appreciated that the terms such as processing, computing, calculating, determining, displaying, and the like refer to actions and processes of a machine, computer system, or electronic circuit configured to manipulate and transform a first set of data represented as physical quantities within registers and/or memory elements into a second (possibly different) set of data similarly represented as physical quantities within registers and/or memory elements.

What is claimed is:

1. An apparatus comprising:
 a soft-output channel detector configured to process an input signal carrying a bit sequence to generate a set of metrics corresponding to one or more paths through a trellis, wherein:
 a path through the trellis comprises a plurality of serially connected branches, each corresponding to a respective bit of the bit sequence; and
 the bit sequence comprises a plurality of modulation bits, each generated by an application of a modulation code to a respective set of parity bits generated using a block error-correction code; and a filter circuit configured to generate one or more output subsets of the set of metrics, wherein at least one of said one or more output subsets is generated based on an inter-bit correlation imposed by the modulation code.

2. The apparatus of claim 1, wherein:
the bit sequence comprises a sequence of non-binary symbols; and
the filter circuit is configured to generate the one or more output subsets such that a generated output subset correspond to respective one of the non-binary symbols.

3. The apparatus of claim 2, wherein:
a non-binary symbol in the sequence of non-binary symbols is represented by m bits, where m is a positive integer greater than one; and
the bit sequence has one modulation bit per r parity bits, where r is a positive integer greater than one and r≠m.

4. The apparatus of claim 2, further comprising:
a log-likelihood-ratio calculator configured to convert the one or more output subsets generated by the filter circuit into log-likelihood ratios that represent the sequence of non-binary symbols based on the input signal and
a parity-check decoder configured to apply parity-check-based decoding to the log-likelihood ratio generated by the log-likelihood-ratio calculator to enable the apparatus to recover information bit encoded in the input signal, wherein the parity-check-based decoding is based on a non-binary low-density parity-check code.

5. The apparatus of claim 1, wherein:
the modulation code is a maximum-transition-run code; and
the block error-correction code is a low-density parity-check code.

6. The apparatus of claim 1, further comprising:
a log-likelihood-ratio calculator configured to convert the one or more output subsets generated by the filter circuit into log-likelihood ratios that represent the bit sequence based on the input signal; and
a parity-check decoder configured to apply parity-check-based decoding to the log-likelihood ratio generated by the log-likelihood-ratio calculator to enable the apparatus to recover information bits encoded in the input signal.

7. The apparatus of claim 6, further comprising a feedback path from the parity-check decoder to the oft-output channel detector wherein:
the parity-check decoder is configured to apply said parity-check-based decoding to a first log-likelihood-ratio word having a set of the log-likelihood ratio generated by the log-likelihood-ratio calculator to generate a second log-likelihood-ratio word; and
when the second log-likelihood-ratio word does not satisfy one or more parity checks of the parity-check-based decoding, the soft-output channel detector is configured to regenerate the set of metrics based on the second log-likelihood-ratio word.

8. The apparatus of claim 7, wherein the feedback path comprises a soft-input/soft-output modulation encoder configured to apply the modulation code to a subset of log-likelihood-ratio value of the second log-likelihood-ratio word to generate a corresponding modulation-encoded set of log-likelihood-ratio values, wherein said modulation-encoded set of the log-likelihood-ratio value represent modulation-encoded parity bit of a corresponding codeword carried by the input signal based on the second log-likelihood-ratio word.

9. The apparatus of claim 6, wherein the parity-check decoder is configured to:
apply said parity-check-based decoding to a first log-likelihood-ratio word to generate a second log-likelihood-ratio word; and
direct the second log-likelihood-ratio word to the soft-output channel detector to enable one or more decoding iterations between the soft-output channel detector and the parity-check decoder.

10. The apparatus of claim 9, further comprising:
a hard-decision filter configured to remove magnitude bit from a first set of log-likelihood-ratio values of the second log-likelihood-ratio word to generate a corresponding modulation-encoded word wherein aid first set of the log-likelihood-ratio values represent modulation-encoded information bit carried by the input signal; and
a modulation decoder configured to apply an additional modulation code to the modulation-encoded information bit to recover the information bit encoded in the input signal.

11. The apparatus of claim 10, wherein the additional modulation code is a run-length limited code or a maximum-transition-run code.

12. The apparatus of claim 10, wherein:
the additional modulation code is a first maximum-transition-run code; and
the modulation code is a second maximum-transition-run code that is different from the first maximum-transition-run code.

13. The apparatus of claim 1, further comprising a front-end circuit configured to generate the input signal based on a signal received from a magnetic recording channel.

14. The apparatus of claim 1, wherein the soft-output channel detector comprises:
a branch-metric processor configured to generate branch metric based on the input signal and the trellis;
a forward detector configured to recursively calculate forward state metrics for the one or more path through the trellis based on the branch metrics, wherein a corresponding recursion is performed in a forward direction;
a backward detector configured to recursively calculate backward state metrics for the one or more paths through the trellis, wherein a corresponding recursion is performed in a backward direction; and
a combined detector configured to calculate the set of metrics based on the branch metric the forward state metrics and the backward state metrics.

15. The apparatus of claim 14, wherein:
the soft-output channel detector is configured for continuous pipelined data flow therethrough using a sliding-window log-(Maximum A Posteriori) algorithm; and
the soft-output channel detector comprises one or more pipeline registers for storing at least some of the calculated metric to enable aid continuous pipelined data flow.

16. The apparatus of claim 14, wherein:
each time node of the trellis has sixteen states, each corresponding to a respective four-bit value;
the set of metrics calculated by the combined detector ha a cardinality of 256; and
each of the one or more output ub et generated by the filter circuit has a cardinality of four.

17. The apparatus of claim 1, wherein the filter circuit comprises a first filter stage having a first branch and a second branch, wherein:
the first branch comprise a first two-bit elect element controlled by a first two-bit compare element and configured to generate a first subset of the set of metrics calculated by the combined detector;

the second branch comprises a second two-bit elect element controlled by a second two-bit compare element and configured to generate a second subset of said set of metrics calculated by the combined detector;

said set of metrics calculated by the combined detector has a first cardinality;

each of the first and second subset has a second cardinality that is smaller than the first cardinality by a factor of four; and the filter circuit is configured to generate the one or more output subsets based on the first and second subsets.

18. The apparatus of claim 17, wherein the filter circuit further comprises a second filter stage coupled to the first filter stage and having a first branch, a second branch, and a third branch, wherein:

the first branch of the second filter stage comprises a third two-bit elect element controlled by a third two-bit compare element and configured to generate a third subset of aid set of metrics calculated by the combined detector by further narrowing the first subset;

the second branch of the second filter stage comprises a fourth two-bit select element controlled by a fourth two-bit compare element and configured to generate a fourth subset of said set of metrics calculated by the combined detector by further narrowing the first subset; and the third branch of the second filter stage comprises a fifth two-bit select element controlled by a fifth two-bit compare element and configured to generate a fifth subset of said set of metrics calculated by the combined detector by further narrowing the second subset;

each of the third fourth and fifth subsets has a third cardinality that is smaller than the second cardinality by a factor of four; and the filter circuit is configured to generate the one or more output subset based on the third, fourth and fifth subsets.

19. The apparatus of claim 18, wherein the filter circuit further comprises a third filter stage coupled to the second filter stage and having a plurality of branches wherein each branch of the third filter stage is configured to generate a respective one of the output subset by further narrowing a respective one of the third, fourth and fifth subsets.

20. The apparatus of claim 1, wherein the filter circuit comprises a plurality of hold elements each configured to temporarily store a respective one of the output subsets generated by the filter circuit, wherein:

the filter circuit is configured to operate at a fractional rate- and at least two of the hold elements arc read out in different respective fractional-rate clock cycles.

* * * * *